(12) United States Patent
Kitagawa et al.

(10) Patent No.: US 6,836,170 B2
(45) Date of Patent: Dec. 28, 2004

(54) IMPEDANCE TRIMMING CIRCUIT

(75) Inventors: Nobutaka Kitagawa, Tokyo (JP);
Shuichi Takada, Yokohama (JP);
Nobuyuki Sasaki, Tokyo (JP);
Yasuhiko Kaminota, Kawasaki (JP)

(73) Assignee: Kabushiki Kaisha Toshiba (JP)

( * ) Notice: Subject to any disclaimer, the term of this patent is extended or adjusted under 35 U.S.C. 154(b) by 0 days.

(21) Appl. No.: 10/723,101

(22) Filed: Nov. 25, 2003

(65) Prior Publication Data

US 2004/0207451 A1 Oct. 21, 2004

Related U.S. Application Data

(63) Continuation-in-part of application No. 10/608,364, filed on Jun. 26, 2003, now abandoned.

(30) Foreign Application Priority Data

Apr. 17, 2003 (JP) .................................. 2003-113191
Aug. 29, 2003 (JP) .................................. 2003-307766

(51) Int. Cl.⁷ .................................................. H03L 5/00
(52) U.S. Cl. ........................ 327/308; 307/99; 326/30
(58) Field of Search .......................... 327/108, 63, 64,
327/306–308, 315; 326/30–34, 82, 86;
307/98, 99

(56) References Cited

U.S. PATENT DOCUMENTS 5,243,229 A * 9/1993 Gabara et al. ................ 307/98
5,666,078 A * 9/1997 Lamphier et al. ............ 327/108
6,002,354 A * 12/1999 Itoh et al. .................... 341/144
6,188,237 B1 * 2/2001 Suzuki et al. ................ 326/30
6,522,175 B2 * 2/2003 Ueno et al. .................. 327/103
6,570,402 B2 * 5/2003 Koo et al. ..................... 326/30

FOREIGN PATENT DOCUMENTS

JP     2003-69412     3/2003

OTHER PUBLICATIONS

Kyoung–Hoi Koo, et al., "A New Impedance Control Circuit for USB 2.0 Transceiver," ESSCIRC 2001.

* cited by examiner

*Primary Examiner*—Minh Nguyen
(74) *Attorney, Agent, or Firm*—Gray Cary Ware & Freidenrich LLP

(57) ABSTRACT

A common bias section is composed of a first series circuit having an internal resistor and an external resistor connected in series and an operational amplifier having a first input terminal connected to a reference voltage, a second input terminal connected to a Vr1 node, and an output terminal connected to the series circuit. An impedance trimming section is composed of a series circuit having an internal resistor and an impedance dummy resistor connected in series, a comparator CMP having a first input terminal connected to the Vr1 node and a second input terminal connected to a Vto1 node, a code control circuit which uses a clock signal to latch an output signal from the comparator to generate a plurality of switching codes, and a switching circuit which switch a resistance value of the impedance dummy resistor.

19 Claims, 18 Drawing Sheets

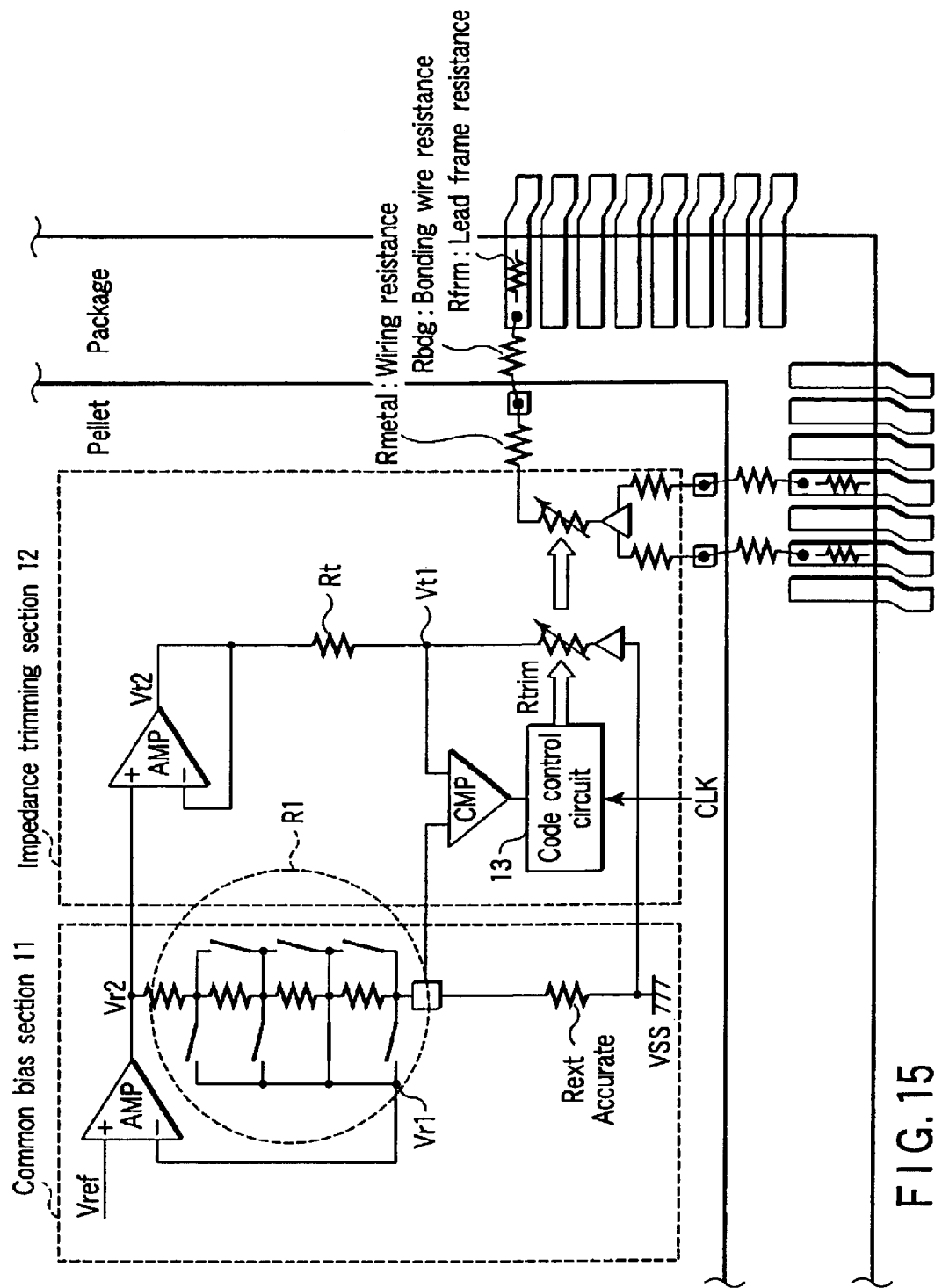
F I G. 15

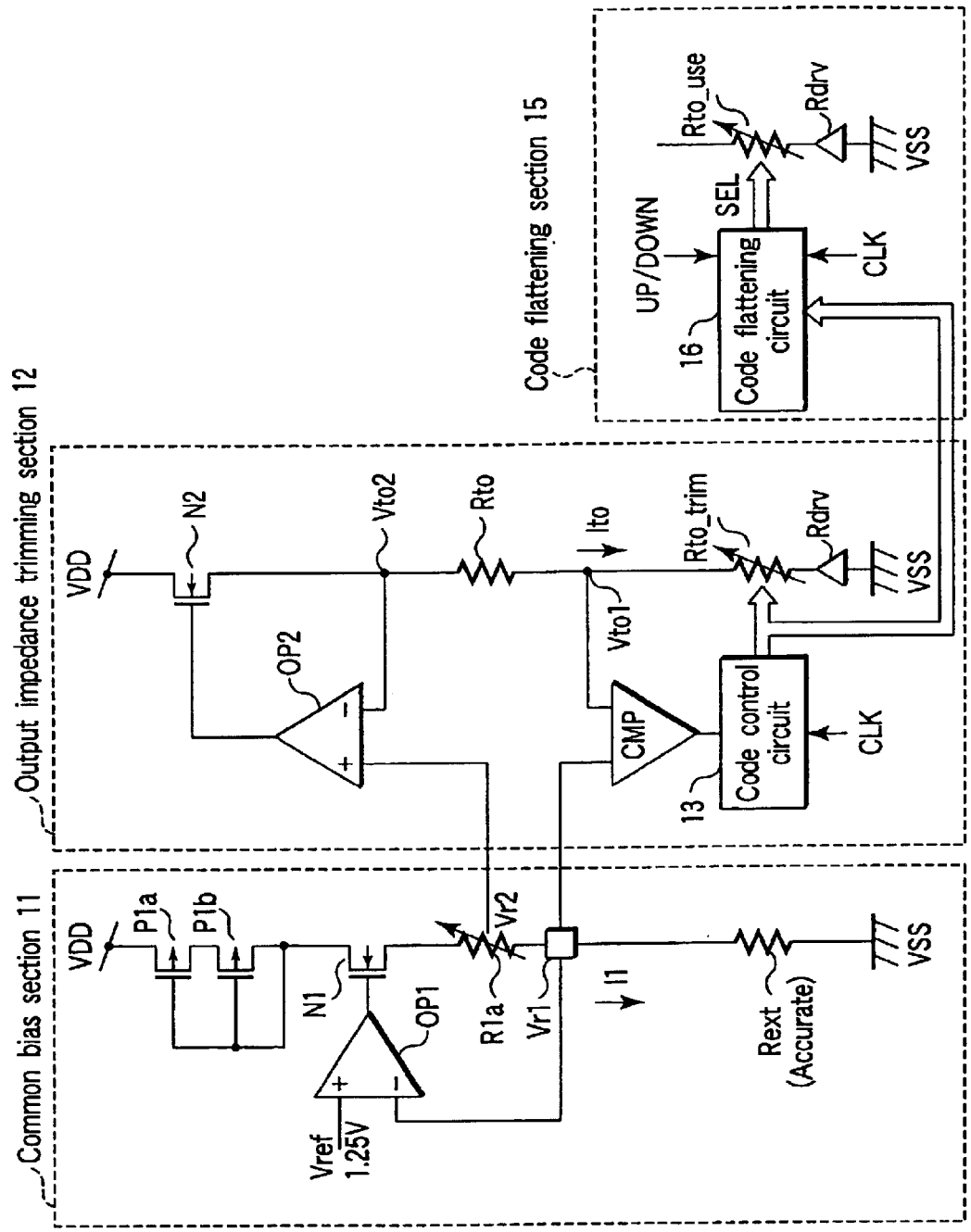
F I G. 22

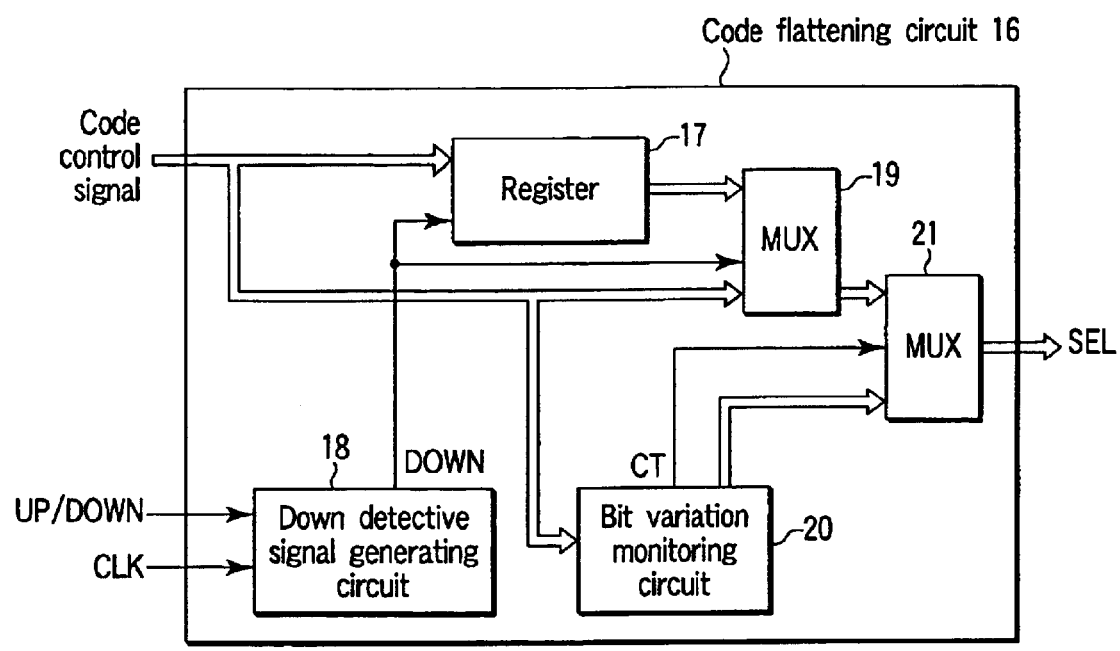
F I G. 23

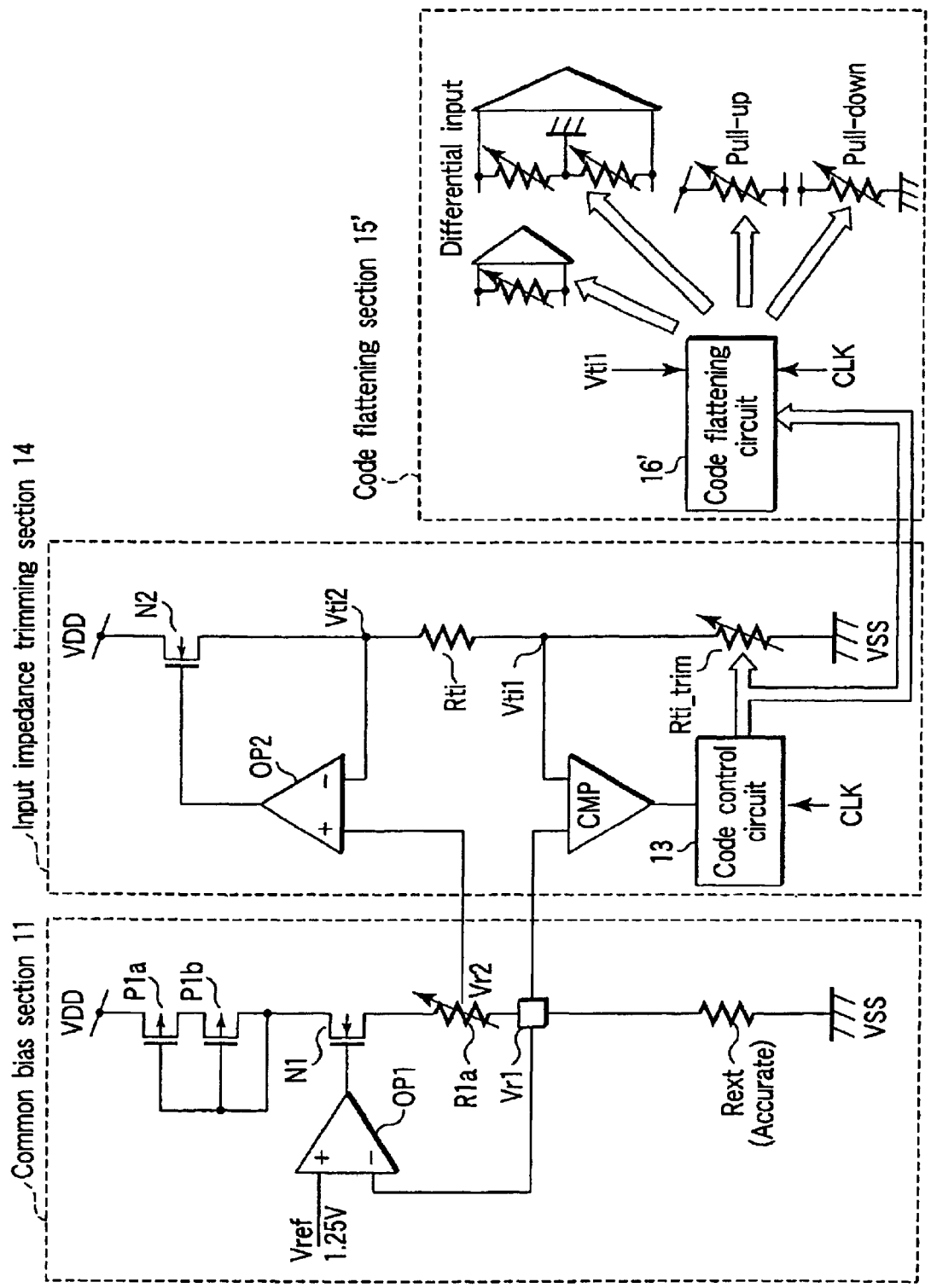
F I G. 28

IMPEDANCE TRIMMING CIRCUIT

CROSS-REFERENCE TO RELATED APPLICATIONS

This is a Continuation-in-Part application of U.S. patent application Ser. No. 10/608,364, filed Jun. 26, 2003 now abandoned, the entire contents of which are incorporated herein by reference.

This application is based upon and claims the benefit of priority from the prior Japanese Patent Applications No. 2003-113191, filed Apr. 17, 2003; and No. 2003-307766, filed Aug. 29, 2003, the entire contents of both of which are incorporated herein by reference.

BACKGROUND OF THE INVENTION

1. Field of the Invention

The present invention relates to an LSI containing an impedance trimming circuit to execute impedance matching on output impedance, input impedance, terminal resistance, or the like to suppress reflection of signals, thus allowing high-speed serial signals of high quality to be transferred, and in particular, to a trimming circuit for accurate and automatic adjustment.

2. Description of the Related Art

For a high-speed interface such as a USB2.0 (480 Mbps) or an LUDS (several Gbps), it has hitherto been essential to match input impedance, drive impedance, pull-up/pull-down resistance, or the like with a corresponding standard value (for example, ±10%) in order to suppress reflection of the waveform of a transferred signal, thus allowing a high-speed signal of high quality to be transmitted.

However, resistance elements manufactured using an LSI manufacturing process vary markedly (for example, ±20%). Further, the on resistance of an output transistor depends significantly on a temperature, a power voltage, or a threshold (for example, worst best=double/half). Accordingly, a certain adjustment circuit is required.

A first example of the prior art is Non-patent Document 1 (ESSCIRC2001 "A New Impedance Control Circuit for USB2.0 Transceiver" Koo K.-H. SAMSUNG Electronics.

In Non-patent Document 1, as shown in FIGS. 1 and 2, an operational amplifier adjusts a voltage drop at an external resistor Rext to an internal reference voltage Vref. An output signal from the operational amplifier is supplied to gates of two P channel MOS transistors. An output signal from an output buffer appears as a positive and negative differential outputs at a Data+terminal and a Data−terminal, respectively, on the basis of voltage drops at internal resistors. This circuit has an auxiliary circuit for adjustment in addition to a circuit for data transfer. The auxiliary circuit finds, in a controlled manner, a code that adjusts the potential at a VA terminal to a value Vref.

In this case, output impedance is based on the internal resistor and MOS resistor. However, in this conventional example, this value is adjusted to 45 Ω±5 Ω. Specifically, a comparator and a control circuit are used to adjust the sizes of the MOS transistors to find a code that results in the smallest error. Then, the sizes of the MOS transistors are increased or reduced, and this code is provided to the output buffer.

However, with this method, the circuit is affected by various variation factors such as a variation in reference voltage, an input offset voltage at the operational amplifier, a variation in the current ratio of a current source composed of the P channel MOS transistors, and a variation in MOS resistance. Thus, actually, it is difficult to accurately adjust the output impedance.

For example, if the current ratio of the current source composed of the P channel MOS transistors varies by about 5%, this mere variation causes the output impedance to reach the limit of the allowable variation range of 45 Ω±5 Ω. Thus, disadvantageously, yield decreases and much labor is required to manage manufacturing steps. Therefore, in reality, it is difficult to accurately adjust the output impedance.

A second example of the prior art is Non-patent Document 2 (ESSCIR2001 "Digitally tuneable on-chip line termination resistor for 2.5 Gbit/s LVDS receiver in 0.25 µm standard CMOS technology" M. Kumric, F. Ebert, R. Rap, K. Welch Alcatel SEL Stuttgart (http://www. esscirc. org/esscirc2001/C01_Presentations/98 .pdf)).

In Non-patent Document 2, as shown in FIG. 3, a value for an internal trimming resistor is switched so that the externally provided reference voltage Vref is closest to a divided voltage resulting from an external resistor and the internal trimming resistor. Then, switching codes are used to switch input terminal resistance.

As shown in FIG. 4, the internal trimming resistor is composed of a resistor R0 connected directly between IP and IN and resistors R1 to R8 each connected via a switch turned on and off in a controlled manner using a code.

As shown in FIG. 5, in consideration of the range of a variation in the value for the internal resistor, a value for the resistor R0 is preset at a larger value. The resistors R1 to R8 are sequentially connected together to adjust the value for the internal trimming resistor over a wide range so that it falls within the range of a standard value of 100 Ω±10 Ω.

However, this method requires an external circuit used to generate the reference voltage Vref as well as two external accurate resistors. This advantageously increases costs. Further, this method is used only for an input terminal section. The adjustment of the output impedance must include the adjustment of the on resistance of the output buffer as shown in the first example of the prior art.

A third example of the prior art is Patent Document 1.

In Patent Document 1 (Jpn. Pat. Appln. KOKAI Publication No. 2001-94048), as shown in FIG. 6, the operational amplifier is used to adjust a current from the current source composed of the P channel MOS transistors so that a voltage drop VZQ at an external resistor PQ is half the voltage at a power source VDDQ. Further, the size of an output driver is adjusted by using a current mirror to allow a current to flow through the output driver so that the resulting voltage drop equals the VZQ.

In this case, a variation in output resistance is affected directly by factors such as the offset voltage at the operational amplifier and a variation in current mirror current. Consequently, accurate adjustment of the current is limited.

It has thus been strongly desirable to provide an impedance trimming circuit which eliminates the adverse effects of variations associated with an LSI manufacturing process to accomplish accurate trimming and which can be constructed using a reduced number of external parts.

BRIEF SUMMARY OF THE INVENTION

According to an aspect of the present invention, there is provided an impedance trimming circuit comprising a common bias section composed of a first series circuit having a first internal resistor and an external resistor connected in series via a first node and a first operational amplifier having a first input terminal connected to an internal reference voltage, a second input terminal connected to the first node, and an output terminal connected to the first series circuit; and an impedance trimming section composed of a second series circuit having a second internal resistor and an impedance dummy resistor connected in series via a second node, a comparator having a first input terminal connected to the first node and a second input terminal connected to the second node, a code control circuit which uses a clock signal to latch an output signal from the comparator to generate a plurality of switching codes, and a switching circuit which uses the plurality of switching codes to switch a resistance value of the impedance dummy resistor, wherein the first operational amplifier is also connected to the second series circuit, and an output signal from the code control circuit is input to a target impedance trimming resistor.

BRIEF DESCRIPTION OF THE SEVERAL VIEWS OF THE DRAWING

FIG. 15 is a diagram showing an impedance trimming circuit according to a fifth embodiment;

FIG. 22 is a view showing the output impedance trimming circuit according to the ninth embodiment;

FIG. 23 is a view showing an example of a code flattening circuit;

FIG. 28 is a view showing the input impedance trimming circuit according to the ninth embodiment;

DETAILED DESCRIPTION OF THE INVENTION

With reference to the drawings, description will be given of an impedance trimming circuit according to an example of the present invention.

1. Outline

First, the impedance trimming circuit according to the example of the present invention has a common bias circuit composed of a reference voltage circuit, an internal resistor R1, an accurate external resistor Rext, and an operational amplifier OP1, and an output impedance trimming circuit composed of another internal resistor Rto, a driver dummy resistor Rdrv, an output impedance dummy resistor Rto_trim, an operational amplifier OP1, a comparator CMP, and a code control circuit.

The following definitions are assumed: the resistance value of the internal resistor is defined as R1, the resistance value of the accurate external resistor is defined as Rext, the resistance value of the second internal resistor is defined as Rto, the resistance value of the driver dummy resistor is defined as Rdrv, and the resistance value of the output impedance dummy resistor is defined as Rto_trim. Then, the value Rto_trim is switched so as to establish the relationship shown below or the relationship closest to it.

Rext: R1=(Rdrv+Rto_trim):Rto

Then, a driver circuit is allowed to reflect this switching information.

The impedance trimming circuit according to the example of the present invention further has an input impedance trimming circuit composed of another internal resistor Rti, an input impedance dummy resistor Rto_trim, an operational amplifier OP2, a comparator CMP, and a code control circuit. A resistance value of this third internal resistor is defined as Rti, and the resistance value of the input impedance dummy resistor is defined as Rti_trim. Then, the value Rti_trim is switched so as to establish the relationship shown below or a relationship closest to it.

Rext:R1=Rti_trim:Rti

Then, an input impedance circuit is allowed to reflect this switching information The impedance trimming circuit has only to have at least one of the output impedance trimming circuit and the input impedance trimming circuit. Further, if only the output impedance trimming circuit or input impedance trimming circuit is used or if both impedance trimming circuits are used, a plurality of impedance trimming circuits of each type may be present.

2. First Embodiment

Figure 7:
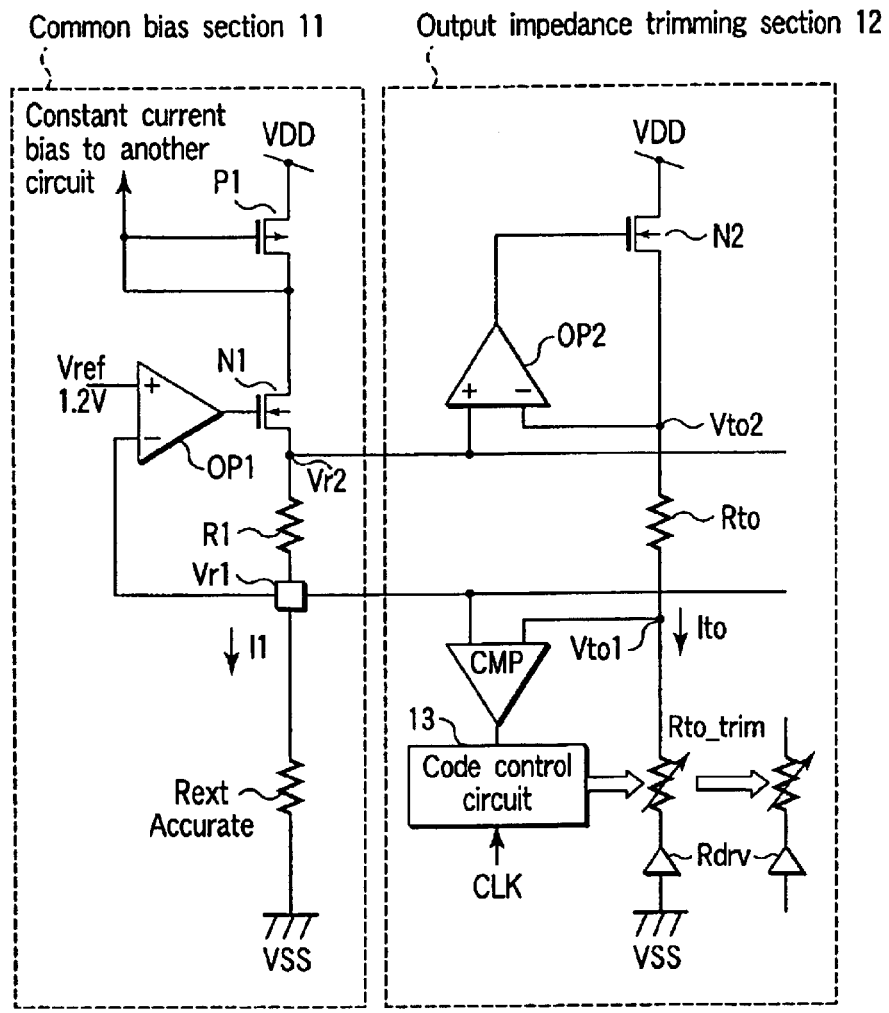
FIG. 7 is a diagram showing an impedance trimming circuit according to a first embodiment.

FIG. 7 shows an impedance trimming circuit according to a first embodiment of the present invention.

Reference character Rdrv (symbol Δ) denotes an output driver. A common bias section 11 has the internal resistor R1 and accurate external resistor Rext connected together via a node Vr1, the operational amplifier OP1 to which an internal reference voltage Vref and the voltage at the node Vr1 are inputted, a P channel MOS transistor P1, and an N channel MOS transistor N1. The P channel MOS transistor P1, connected to a power source VDD, is a bias generating circuit used to generate a small-current bias provided to another circuit. This is an accessory circuit.

Operations of this circuit will be described below with reference to FIG. 7.

The operational amplifier OP1 controls a gate voltage of the N channel MOS transistor (current control element) N1 so that the voltage Vr1 equals the internal reference voltage Vref. The voltage Vr2 is the voltage Vr1 plus a voltage drop at the resistor R1 with a current I1, i.e. Vr2=Vr1+(R1/Rext)×Vr1.

A specific example of calculation will be shown below.

The internal reference voltage Vref is assumed to be, for example, 1.2 V±5%. The external resistor Rext is assumed to offer an accurate resistance of, for example, 12 K Ω±0.1%. The power voltage VDD is assumed to be, for example, 3.3 V±10%. The offset voltage at the operational amplifier OP1 is assumed to be, for example, ±10 mV.

A negative feedback circuit composed of the operational amplifier OP1 and the N channel MOS transistor (current control element) N1 operates to make a value for a voltage drop at the external resistor Rext equal to the internal reference voltage Vref. As a result, Vr1 becomes Vref. The accuracy is (1.2 V±5%)±10 mV, i.e. 1.2 V±0.07 V owing to the effects of a variation in internal reference voltage Vref and the offset voltage at the operational amplifier OP1.

The current I1 is equal to Vr1/Rext. The current I1 also varies and is within the range of, for example, 100 μA±7 μA. A voltage Vr2 is affected directly by a variation in a value for the internal resistor R1. If the variation in the value for the internal resistor R1 is, for example, 2.4 K Ω±20%, then the voltage Vr2 is given as follows:

$$Vr2=Vr1+I1\times R1=(1.2V\pm 0.07V)+(100 \mu A\pm 1 \mu A)\times(2.4k \Omega\pm 0.48k \Omega)=1.44V\pm 0.13V$$

Importantly, the voltage Vr2 corresponds to the detection of a ratio containing a difference in resistance value between the internal resistor R1 and the external resistor Rext.

Now, description will be given of an output impedance trimming section 12.

The output impedance trimming section is composed of the comparator CMP to which the voltage Vr1 and a voltage Vto1 are inputted, an operational amplifier OP2 to which the voltage Vr2 and a voltage Vto2 are inputted, a code control circuit 13 that receives an output signal from the comparator CMP, an N channel MOS transistor (current control element) N2, the internal resistor Rto, the output impedance dummy resistor Rto_trim, and the output driver dummy resistor Rdrv.

The operational amplifier OP2 controls a gate voltage of the N channel MOS transistor N2 so that the voltage Vto2 equals the voltage Vr2. In this condition, the voltage Vto1 is divided into Rto and (Rto_trim+Rdrv). However, importantly, the ratio of Rext to R1 is equal to the ratio of Rto_trim+Rdrv to Rto.

$$Rext: R1=(Rto\_trim+Rdrv):Rto$$

The value for the external resistor Rext is accurate. Thus, even if the value for the internal resistor R1, Rto, Rto_trim, or Rdrv varies, the value Rto_trim+Rdrv can generally be accurately brought into the range of a standard value by manufacturing a circuit so that R1 and Rto have a good relative accuracy.

The code control circuit 13 is composed of, for example, a multistage shift register. An output from the comparator CMP, a result of a comparison of Vr1 with Vto1, is inputted to the multistage shift register that carries out a shifting operation on the basis of a clock signal CLK. A code is obtained from each stage of the shift register to switch among the resistors. To switch among the resistors, it is possible to use, for example, the circuit shown in the second example of the prior art.

Then, as the clock signal CLK is supplied many times, the state is established where the relationship between the potentials Vr1 and Vto1 exhibits the most frequent switching between a positive side and a negative side, i.e. the potentials Vr1 and Vto1 have the closest values that vary between the positive side and the negative side or where the code is stopped and stabilized. This state corresponds to a code with which the value Rto_trim+Rdrv is closest to the standard.

A specific example of a calculation will be shown below.

If the offset voltage at the operational amplifier is, for example, ±10 mV, then the following equation is given;

$$Vto2=Vr2\pm 10\ mV=1.44\ V\pm 0.13\ V\pm 10\ mV=1.44\ V\pm 0.14\ V$$

A current value Ito is equal to Vto2/(Rto+Rto_trim+Rdrv).

Because of the current Ito, Vto1 has the following voltage effects:

$$Vto1=Ito1\times(Rto\_trim+Rdrv)$$

Consequently, the following equation is established:

$$Vto1=Vto2/(Rto+Rto\_trim+Rdrv)\times(Rto\_trim+Rdrv)=Vto2/(1+Rto/(Rto\_trim+Rdrv))$$

Vto2 is determined by the ratio of Vto2 to resistance.

The comparator CMP selects Rto_trim so that Vr1 is closest to Vrto1. Accordingly, on this occasion, if the offset voltage at the comparator CMP is defined as Voffcmp (±20 mV), then the following equation is given:

$$Vto1=Vr1\pm Voffcmp$$

Specifically, the right side=1.2 V±0.07 V±0.02 V=1.2 V±0.09 V.

If the right side equals the left side Vto1, then the following equation is established:

$$1.2V\pm 0.09V=(1.44V\pm 0.14V)/(1+Rto/(Rto\_trim+Rdrv))$$

Here, it is assumed that the output impedance trimming circuit composed of Rto and (Rto_trim+Rdrv) offers resistance that is, for example, six times as large as that of an actual output buffer circuit in order to reduce current consumption. Accordingly, if an actual driver output impedance is to be 45%, then Rto_trim+Rdrv is 270 Ω.

Rto is 54 Ω on the basis of the relationship Rext:R1=(Rto_trim+Rdrv):Rto, i.e. 12 K Ω:2.4 K=270 Ω:54%.

Further, it is assumed that Rto_rim+Rdrv=270 Ω, Rto_trim=240 Ω, and Rdrv=30 Ω.

Importantly, the resistors R1 and Rto are formed within the same integrated circuit and can thus be manufactured so as to have a good relative accuracy. Further, the resistor Rto_trim can also be manufactured so as to have a good relative accuracy. However, since the resistor Rdrv is composed of, for example, a MOS transistor, its variation contains a variation associated with the manufacture of the transistor.

This is substituted into the previous equation.

$$1.2V \pm 0.09V = (1.44V \pm 0.14V)/(1+(Rto/(Rto\_trim+Rdrv)))$$

Then, the following equation is established:

$$Rto/(Rto\_trim+Rdrv)=((1.44V \pm 0.14V)/(1.2V \pm 0.09V))-1$$

Accordingly, the adjusted resistance value Rto_trim is written on the left side, the following equation is given:

$$Rto\_trim=(Rto/((1.44V \pm 0.14V)/(1.2V \pm 0.09V))-1)-Rdrv$$

Specific values are substituted into the above equations. If the following assumptions are made:

$$Rdrv=30 \text{ } \Omega \pm 20 \text{ } \Omega,$$

$$Rto=54 \text{ } \Omega \pm 10.8 \text{ } \Omega,$$

then the following equation is given:

$$Rto\_trim=(54 \text{ } \Omega \pm 10.8 \text{ } \Omega)/((1.44V \pm 0.14V)/(1.2V \pm 0.09V)-1))-(30 \text{ } \Omega \pm 20 \text{ } \Omega)$$

If a center condition is used for all cases, then the following calculation can be executed:

$$Rto\_trim(\text{center})=(54 \text{ } \Omega/((1.44V/1.2V)-1))-30 \text{ } \Omega=240 \text{ } \Omega$$

That is, if Rto_trim is adjusted to be closest to 240 Ω, the final value is determined to be 240 Ω.

If the value for the resistor Rdrv connected in series with the resistor Rto_trim is added to this final value, then 30 Ω+240 Ω=270 Ω. Thus, the resistance is accurately adjusted to a value that is six times as large as the target one, i.e. 45 Ω.

Variations in various factors can be determined using the above calculation. However, this requires various calculations and their description is thus omitted. An important point is that a wide range of variation is assumed so that the value for the output impedance dummy resistor Rto_trim can be adjusted over a wide range.

Figure 8:
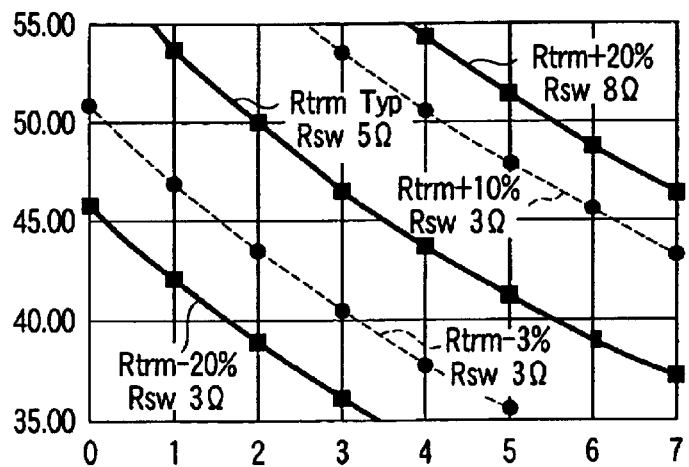
FIG. 8 is a graph showing the relationship between codes and output impedance.

FIG. 8 shows an example of an adjustment range for the trimming circuit.

Actually, under the same conditions as those for the driver circuit, too large a current may flow. Thus, to limit the current, the value for the output impedance dummy resistor Rto_trim is designed to be about six times as large as the target value. Table 1, shown below, shows this value in terms of the impedance of the output driver.

TABLE 1

| Rtrm | 53.33 | *0.8 | *1.2 | *0.9 | *1.1 |
|---|---|---|---|---|---|
| Rsw | 5 | 3 | 8 | 3 | 8 |
| Code | Typ | (−20%) | (+20%) | (−10%) | (+10%) |
| 0 | 58.33 | 45.67 | 72.00 | 51.00 | 66.67 |
| 1 | 53.70 | 41.96 | 66.43 | 46.83 | 61.57 |
| 2 | 40.80 | 38.84 | 61.76 | 43.32 | 57.28 |

TABLE 1-continued

| 3 | 46.48 | 36.19 | 57.78 | 40.33 | 53.63 |
|---|---|---|---|---|---|
| 4 | 43.62 | 33.90 | 54.34 | 37.76 | 50.48 |
| 5 | 41.13 | 31.90 | 51.35 | 35.53 | 47.74 |
| 6 | 38.94 | 30.15 | 48.73 | 33.55 | 45.33 |
| 7 | 37.00 | 28.60 | 46.40 | 31.80 | 43.20 |

This table shows how the output impedance of the actual driver varies when the code control circuit 13 is switched among eight states obtained by constructing the code control circuit 13 using a 7-stage shift register.

This graph contains the range of a variation and is based on the assumptions that Rto_trim is 20% and that a switch required for switching operations offers resistance 5 Ω+3 Ω/−2 Ω.

For calculations, it is assumed that the resistance value of each switch=5 Ω, R1, . . . R7=560 Ω, and the driver resistance Rdrv=5 Ω.

In consideration of a variation in the value for the internal resistor, Rto_trim+Rdrv is set so as to be arbitrarily switched within a certain range around a target value (in this case, 45 Ω) using codes.

For example, for the driver circuit, Rto+Rdrv is set to be 58.33 Ω at maximum and 37 Ω at minimum. Cases indicated by *0.8 and *1.2 are examples of calculations that take various variations or dependencies into consideration. Under a standard condition, the optimum value of 45 Ω lines between codes 3 and 4. However, under the best condition indicated by *0.8, the optimum value is found between codes 0 and 1. Under the worst condition indicated by *1.2, the optimum value is found between codes 6 and 7.

It is evident that even if the standard value is set at 45 Ω±5 Ω, the value can be adjusted even with a variation of ±20% in the value for the internal resistor.

Consequently, Vt1≈Vto2, Ito, and others are controlled so that Vr1 equals Vto1. Therefore, the values including Vref are only intermediate variables for a control system the final result of which is an accurate resistance ratio. It is thus evident that direct effects have been eliminated.

Furthermore, importantly, although not shown in detail, the present circuit is very insensitive to Vref, the offset voltage at the operational amplifier OP1, a variation in current, and the like. The resistance ratio of R1 to Rto must be accurate, but a relative accuracy of ±0.5% or less can be easily accomplished by arranging these resistors so as to occupy a certain area or larger in the LSI and to lie close to each other.

Figure 9:
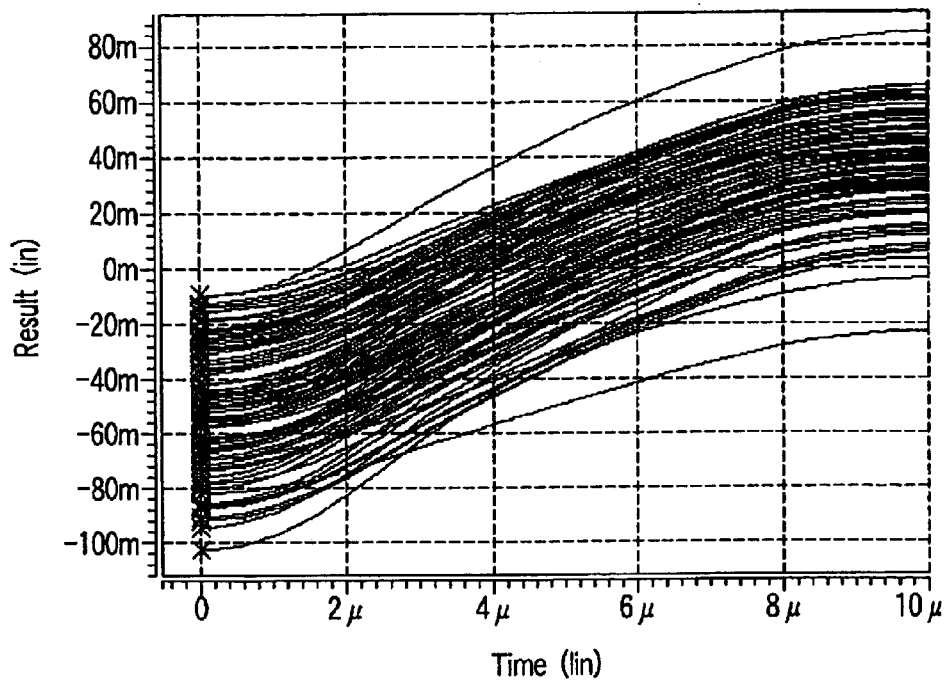
FIG. 9 is a graph showing the results of simulation using SPICE.

FIG. 9 shows the results of circuit simulation using SPICE except for the impedance trimming circuit Rtrim.

In this figure, the axis of ordinate indicates Vto1 to Vr1, an input to the comparator CMP, while the axis of abscissa indicates the elapsed time from 0 to 10 μs. This figure shows the results of simulation obtained by linearly varying the value Rtrim. Even if the ranges of variations described above are combined together 100 times using a Monte Carlo method, all lines other than the lower two cross a 0-V line. This indicates the possibility of adjustment.

Figure 10:
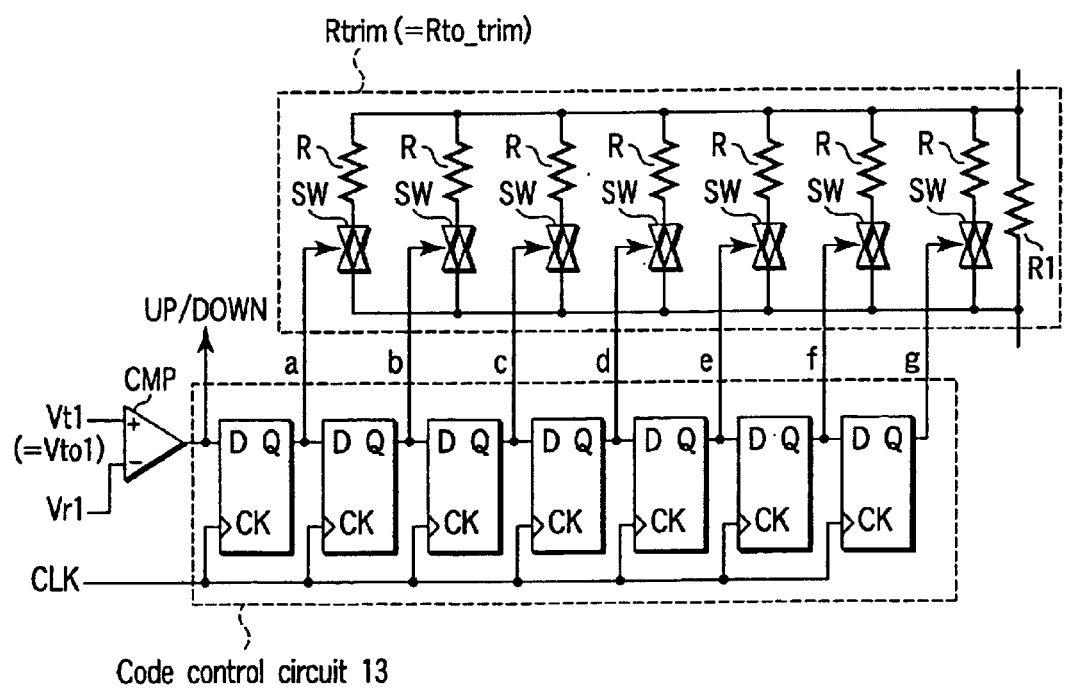
FIG. 10 is a diagram showing an example of a code control circuit and an impedance dummy resistor.

FIG. 10 shows an embodiment of the control circuit and impedance dummy resistor.

A code control circuit 13 comprises, e.g., a seven-stage shift register. An impedance dummy resistor Rto trim comprises a resistor R1 and seven series elements connected in parallel with the resistor R1. Each of the series elements comprises a resistor R and a switch SW.

It should be noted that the resistance values of the resistors R and R1 are denoted by Rtrm. Also, the resistance values of the resistors R and R1 which are measured when the respective switches are turned on are denoted by Rsw. The following explanation will be given on the supposition that Rsw is 0.

In this embodiment, the number of code control signals (code values) is eight. For example, they are 0 to 7. To be more specific, when all the output signals a, b, ... g of the code control circuit 13 are "L" (="0"), e.g., the code value is 0, all the switches SW are turned off, and the resistance value of the impedance dummy resistor Rto trim is equal to Rtrm.

When one of the output signals a, b, ... g of the code control circuit 13 is "H" (="1"), e.g., the code value is 1, one of the switches SW is turned on, and the resistance value of the impedance dummy resistor Rto trim is Rtrm/2.

In such a manner, with respect to the output signals a, b, ... g of the code control circuit 13, the impedance dummy resistor Rto trim varies within a range from Rtrm to Rtrm/(K+1) in accordance with the number of signals indicating "1".

Figure 1:
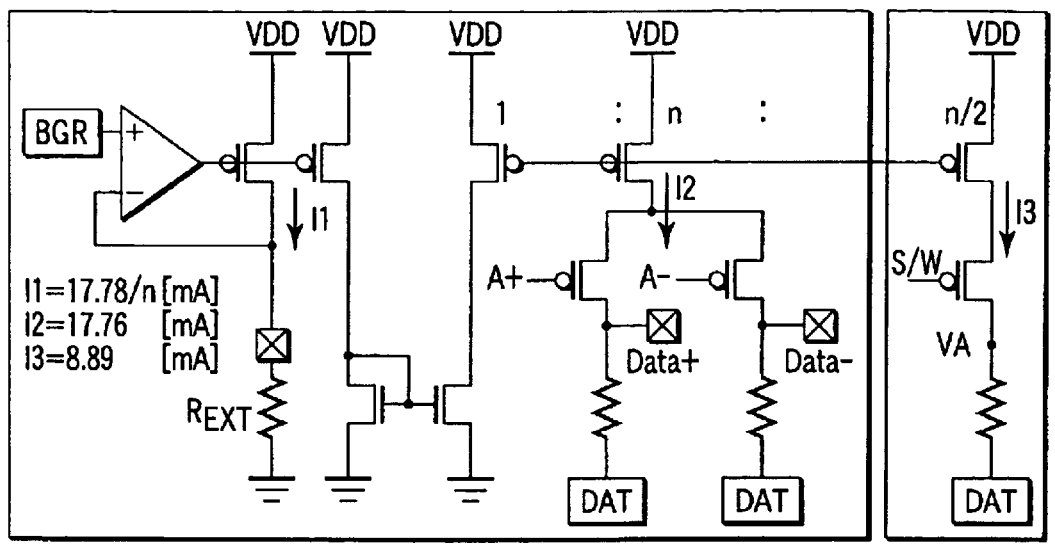
FIG. 1 is a diagram showing a conventional impedance trimming circuit.
Figure 2:
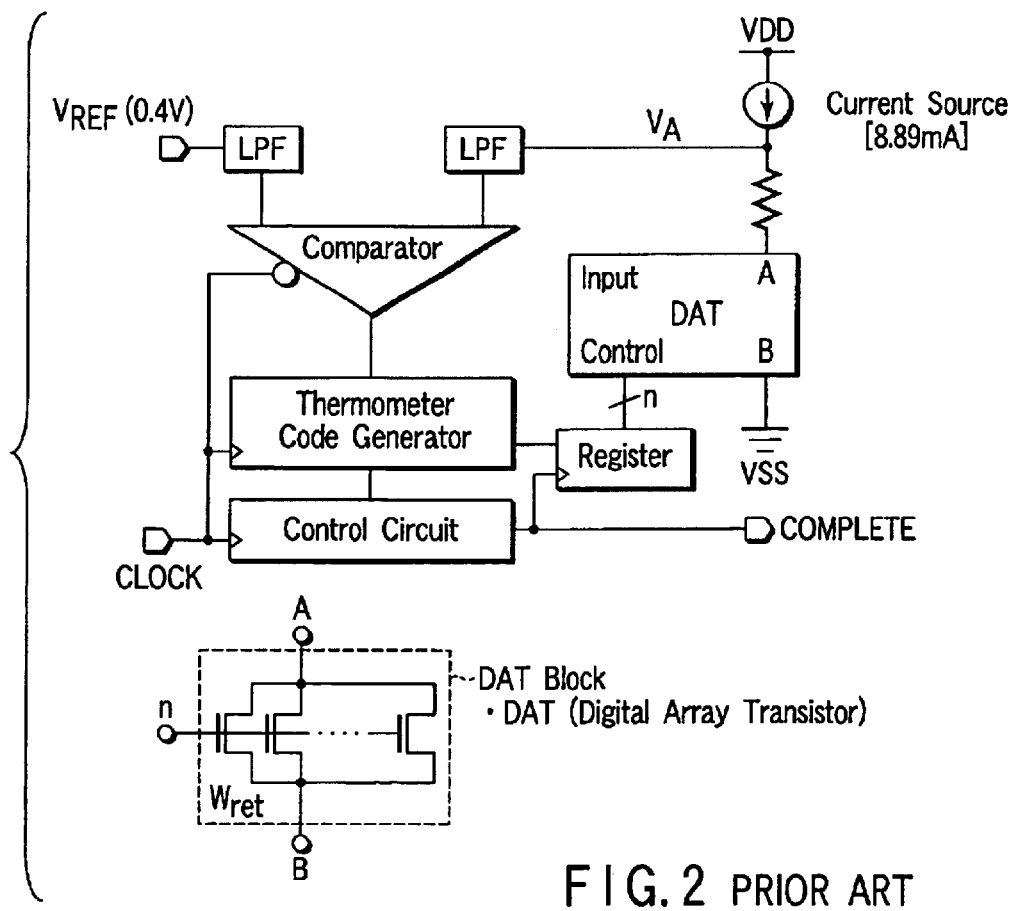
FIG. 2 is a diagram showing a conventional impedance trimming circuit.
Figure 3:
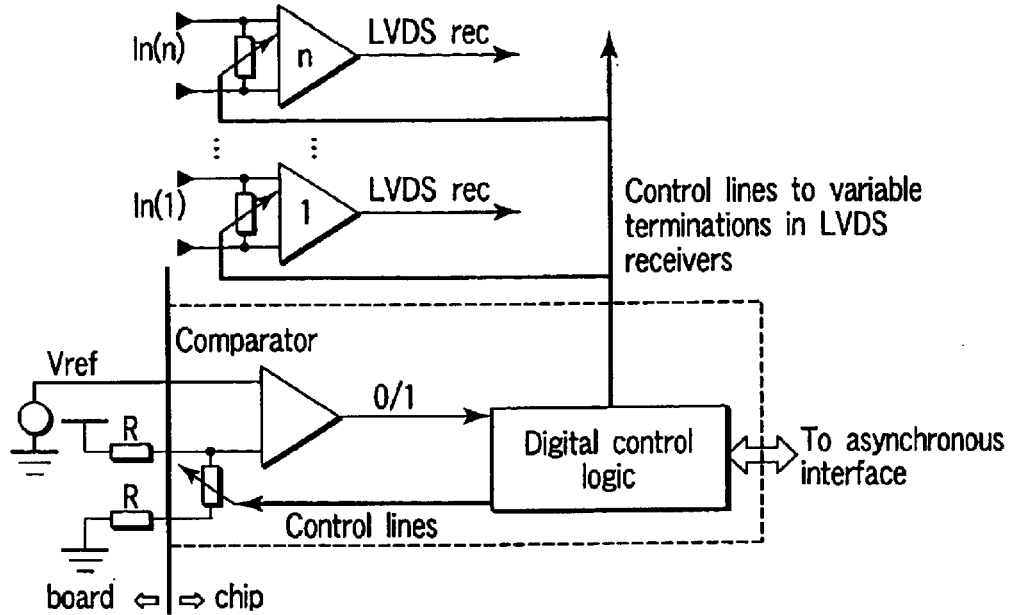
FIG. 3 is a diagram showing a conventional impedance trimming circuit.
Figure 4:
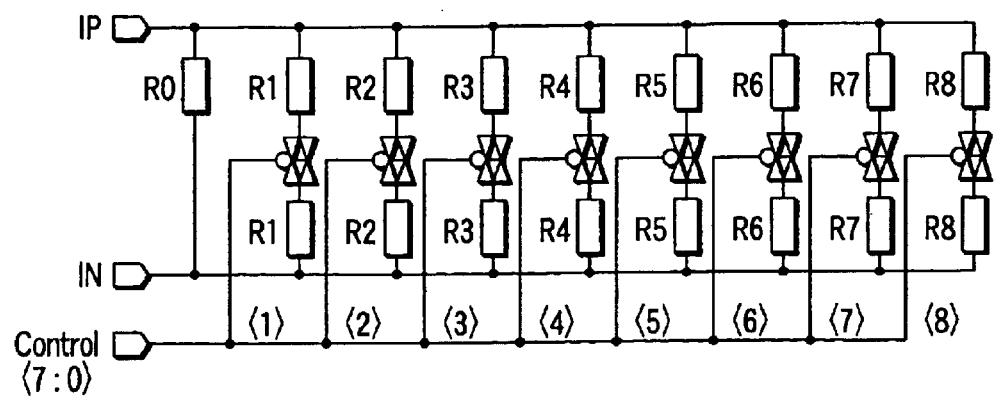
FIG. 4 is a diagram showing an example of a conventional trimming resistor.
Figure 5:
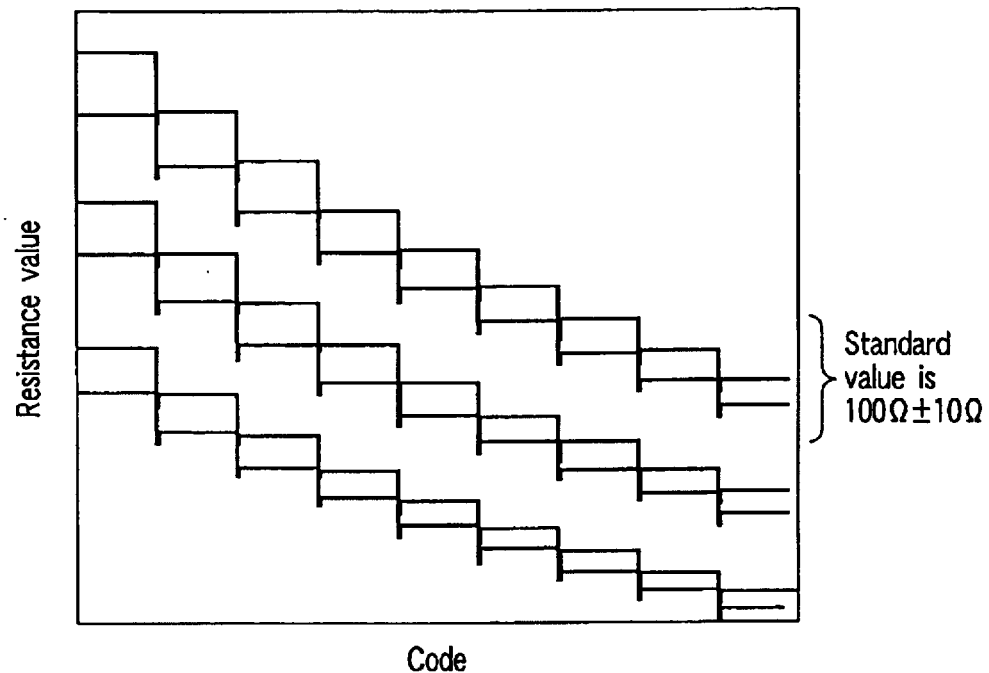
FIG. 5 is a diagram showing the relationship between codes and the resistance value of the trimming resistance.
Figure 6:
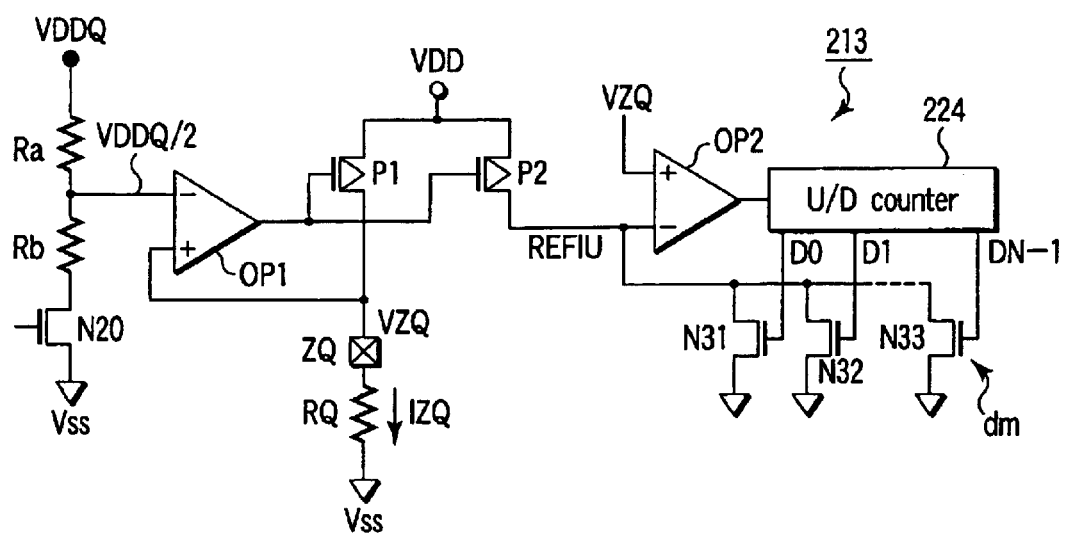
FIG. 6 is a diagram showing a conventional impedance trimming circuit.

In the circuit according to the above embodiment, when Vto1>Vr1, the comparator shown in FIG. 1 continuously outputs "1". The output "1" from a comparator CMP synchronizes with a clock signal CLK. The stages of the shift registers successively receive the output "1". That is, when Vto1>Vr1, the number of those of the output signals a, b, ... g of the code control circuit 13, which indicate "1", increases by degrees.

To be more specific, the code value increases by degrees, the number of switches SW which are in the ON state increases by degrees, and the resistance value of the impedance dummy resistor Rto trim lowers by degrees.

On the other hand, when Vto1<Vr1, the comparator in FIG. 1 outputs "0". The output "0" synchronizes with the clock signal CLK. The stages of the shift register successively receives the output "0". Then, when a predetermined time period lapses, and "1" input to the first stage of the shift register is output from the last stage thereof, the code value decreases, the number of switches SW which are in the ON state decreases, and the resistance value of the impedance dummy resistor Rto trim increases.

Thereafter, the code value repeatedly varies between a value at which "Vto1>Vr1" is satisfied and a value at which "Vto1<Vr1" is satisfied (periodic variation). This applies to a case where the code value varies by a 1-bit width (between two values). In a case where the code value varies by a two-bit width (between three values), it repeatedly varies between a value at which "Vto1≧Vr1" is satisfied and a value at which "Vto1≦Vr1" is satisfied.

In the above manner, the code value is set to be optimal. When all the values of the stages of the shift register are "1", i.e., all the resistors R1 are electrically connected in parallel, and then when Vto1≧Vr1, the code value is determined in this state (it is set at the maximum value "7"). When all the values of the stages of the shift register are "0", i.e., the highest resistance value is set (only the resistance value of a resistor R1 is used), and then when Vto1≦Vr1, the code value is determined in this state (it is set at the minimum value "0").

Figure 11:
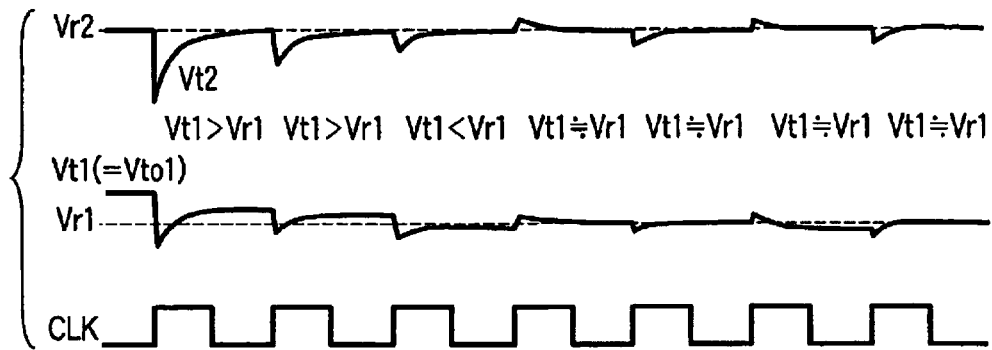
FIG. 11 is a diagram showing waveforms observed during impedance adjustment.

The operational waveform diagram in FIG. 11 indicates this adjustment.

This figure shows how the state changes.

3. Second Embodiment

Figure 12:
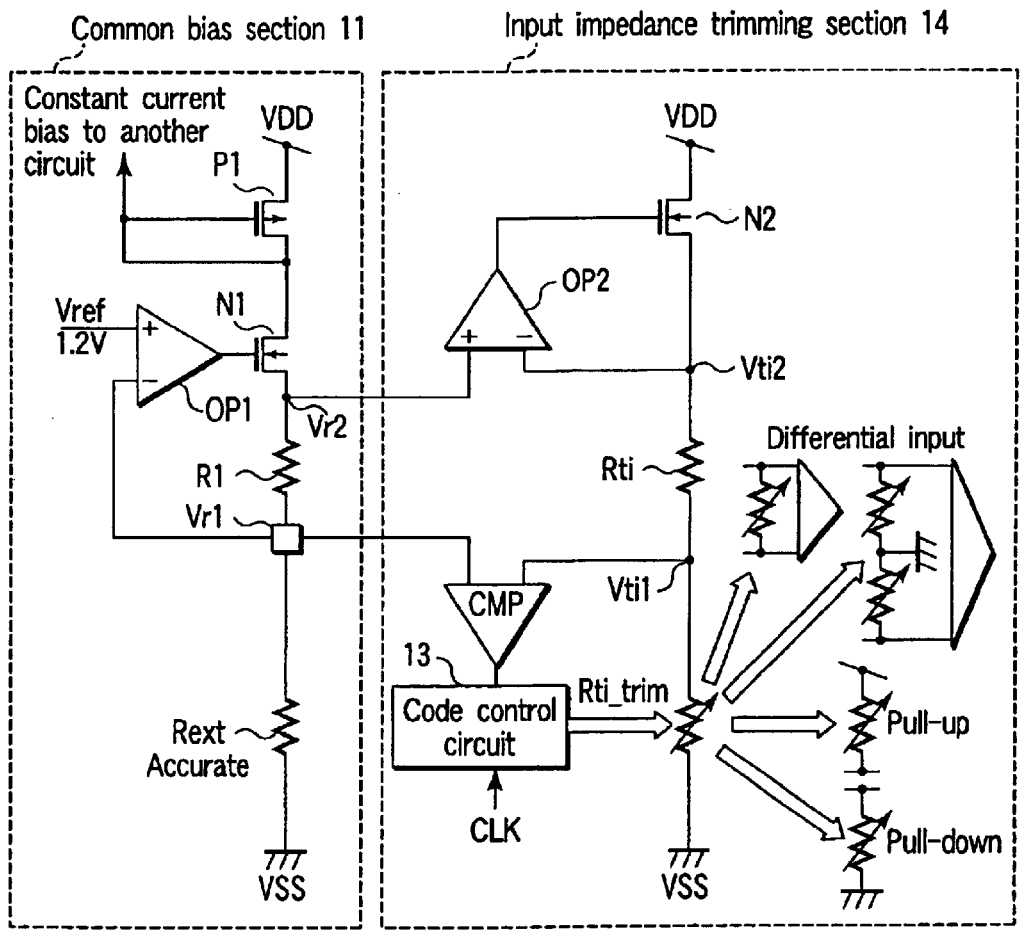
FIG. 12 is an impedance trimming circuit according to a second embodiment.

FIG. 12 shows an impedance trimming circuit according to a second embodiment of the present invention.

This embodiment relates to an input impedance trimming circuit 14. Compared to the above output impedance trimming circuit, this circuit does not require any driver dummy resistors or drivers but simply trims resistance and uses the code obtained to adjust the input impedance.

Operations of this circuit are the same as those in the first embodiment. Their description is thus omitted.

4. Third Embodiment

Figure 13:
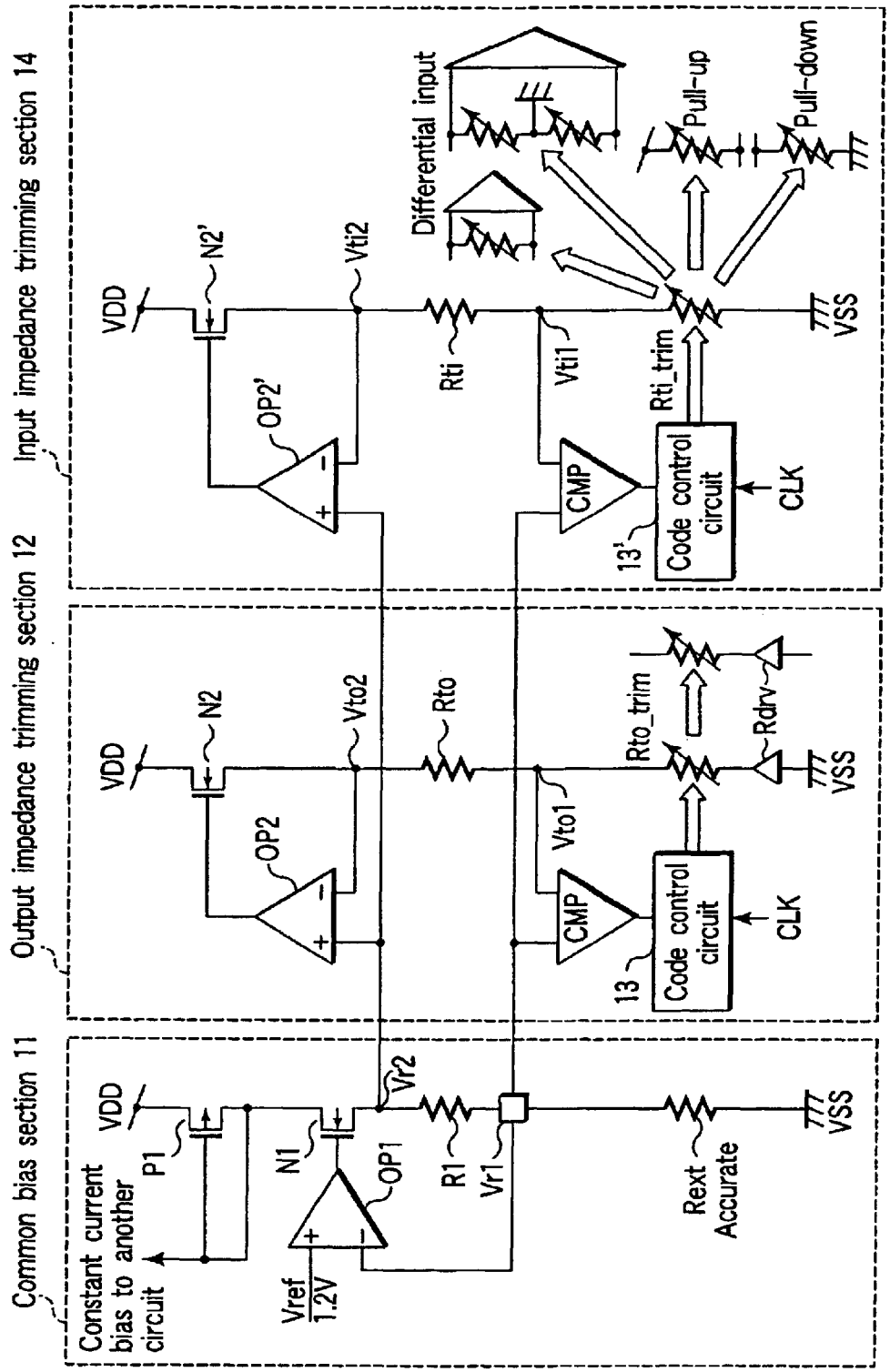
FIG. 13 is an impedance trimming circuit according to a third embodiment.

FIG. 13 shows an impedance trimming circuit according to a third embodiment of the present invention.

This embodiment relates to an I/O impedance trimming circuit. This circuit has the output impedance trimming section 12 and the input impedance trimming section 14. In this case, a single common bias section 11 can be shared by the output impedance trimming section 12 and the input impedance trimming section 14.

Operations of this circuit are the same as those in the first embodiment. Their description is thus omitted.

5. Fourth Embodiment

Figure 14:
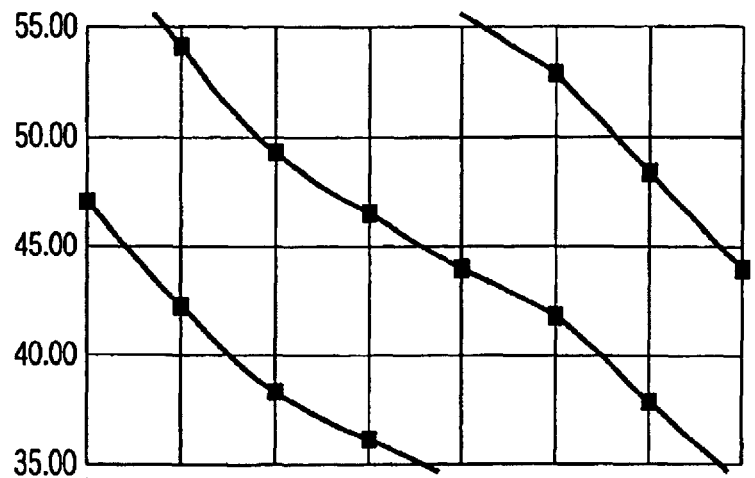
FIG. 14 is a graph showing the relationship between codes and output impedance according to a fourth embodiment.

FIG. 14 shows an impedance trimming circuit according to a fourth embodiment of the present invention.

This embodiment relates to a resistance adjustment circuit.

With the method shown in the second example of the prior art, the impedance is adjusted by connecting the resistor R0 in parallel with the resistors R1 to RB having the same resistance value as the resistor R0. However, this method is disadvantageous in that the number of code increases with the allowable variation range and that it is necessary to switch the resistance over a wide range from smaller to larger resistance.

In this embodiment, the relationship between the code and the resistance value is represented by an S-shaped curve or a polygonal line. Accordingly, even with a wide range of variation, the impedance can be adjusted using a small number of codes.

Specifically, for example, in the second example of the prior art, the value for the resistor R0 is set at 55 Ω. The value for the resistors R1 and R2 is set at 67 Ω. The value for the resistors R3, R4, and R5 is set at 100 Ω. The value for the resistor R6 is set at 42 Ω. The value for the resistor R7 is set at 33 Ω. In this manner, the different resistance values are used for the respective resistors so that the relationship between the code and the resistance value is represented by an S-shaped curve or a polygonal line.

In this regard, a decode circuit may be provided which serves to change the resistance values used for adjustment. Rather than using simple shift registers for switch control, this decode circuit detects the number of level 1 on the basis of an output from each stage of the multistage shift register, to select resistors to be connected in parallel on the basis of this number.

6. Fifth Embodiment

FIG. 15 shows an impedance trimming circuit according to a fifth embodiment of the present invention.

This embodiment relates to a resistance adjustment circuit and is an applied example of the resistance adjustment shown in the first embodiment.

The LSI has the following parasitic resistances: lead frame resistance, bonding wire resistance, intra-pellet wiring resistance, and the like, which are parasitic on a package. Thus, from the outside of the package, the impedance of the LSI appears like a series connection of all these resistances. In this embodiment, all these parasitic resistances are estimated before the value for the impedance dummy resistor Rtrim is adjusted. Then, the impedance is adjusted to exhibit a desired value with all parasitic resistances present.

For example, if wiring resistance Rmetal is 0.5 Ω, bonding wire resistance Rbdg is 0.3 Ω, and lead frame resistance Rfrm is 0.2 Ω, then the resistance of the whole current path from power pin to output pin of the buffer is 2×(0.5 Ω+0.3 Ω+0.2 Ω)=2 Ω.

In such a case, the impedance dummy resistance Rtrim may be adjusted to a value smaller than the desired resistance value, 45 Ω), by about 2 Ω, i.e. 43 Ω. However, with the present circuit, it is cumbersome to switch the value for the impedance dummy resistor Rtrim around this value, 43 Ω.

In this embodiment, the adjustment range of the value for the impedance dummy resistor Rtrim can be shifted by switching the value for the resistor R1.

If Rext:R1=Rtrim:Rt and Rtrim is to be changed from 45 Ω to 43 Ω for adjustment, the value R1 may be increased by a value of 45/43. In this case, to allow the value R1 to be switched with all expected parasitic resistances taken into account, an LSI pattern may be provided before the value R1 is increased or reduced. A switching operation may be performed by using an analog switch, switching the metal layer using a master slice, or using other methods.

Figure 16:
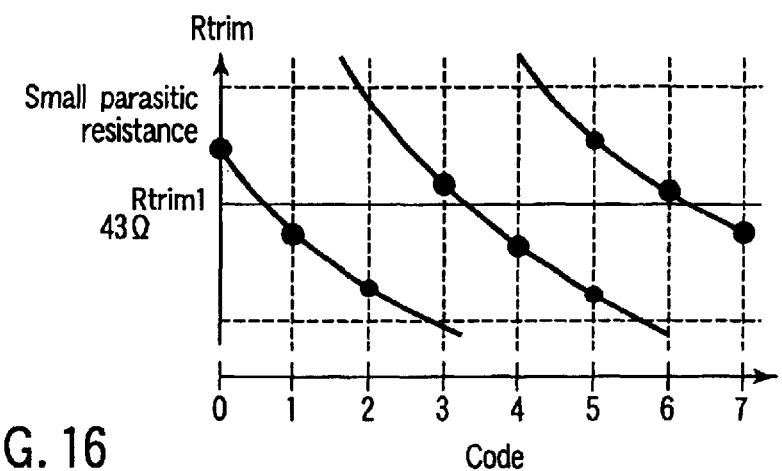
FIG. 16 is a graph showing the relationship between codes and the resistance value of an impedance dummy resistor.
Figure 17:
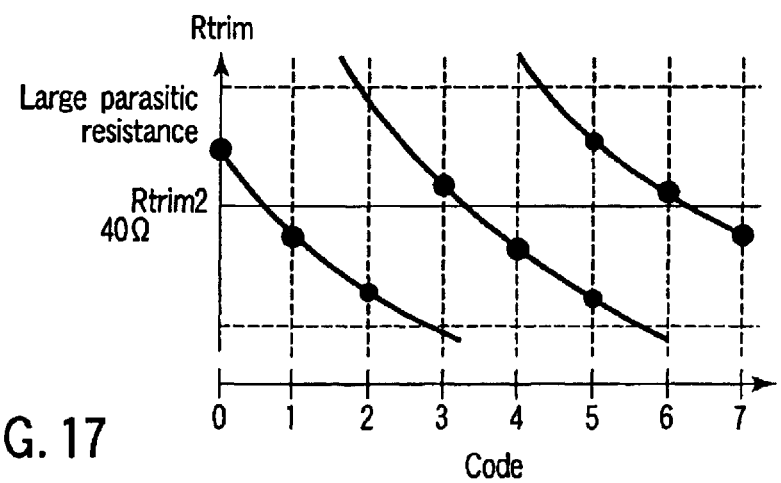
FIG. 17 is a graph showing the relationship between the codes and the resistance value of the impedance dummy resistor.

FIGS. 16 and 17 show an example of a variation in resistance with respect to the code observed if the value for the impedance dummy resistor Rtrim is switched with the parasitic resistances taken into account.

As shown in these figures, if the parasitic resistances are small, the value for the impedance dummy resistor Rtrim can be switched around a larger value, e.g. 43 Ω. On the other hand, if the parasitic resistances are large, the value for the impedance dummy resistor Rtrim can be switched around a smaller value, e.g. 40 Ω.

Even with a different package, the impedance can be kept constant according to this embodiment.

7. Sixth Embodiment

Now, description will be given of an impedance trimming circuit according to a sixth embodiment of the present invention.

This embodiment is a variation of the above described fifth embodiment. Specifically, in FIG. 15, the value for the accurate resistor Rext need not necessarily be singular. For example, if the accurate resistor Rext has a resistance value of 12 Ω, the value for the resistor R1 is set at 2.4 k Ω. On the other hand, if the accurate resistor Rext has a resistance value of 13 k Ω, the value for the resistor R1, 2.4 k Ω, may be increased by (13/12)×2.4 k Ω up to 2.6 k Ω.

Operations of this circuit are omitted, but the relationship Rext:R1=Rtrim:Rt is maintained.

Thus, the impedance can be kept constant even with a change in the value for the accurate resistor Rext.

8. Seventh Embodiment

Now, description will be given of an impedance trimming circuit according to a seventh embodiment of the present invention.

This embodiment is a combination of the above described fifth and sixth embodiments. When the fifth and sixth embodiments are thus combined together, the resistance value of the resistor R1 can be switched to correct the resistance value of the accurate resistor Rext and the values for various resistances parasitic on the package. That is, the impedance can be kept constant even with a change in the value for the accurate resistor Rext or in the type of the package.

9. Eighth Embodiment

Now, description will be given of an impedance trimming circuit according to an eighth embodiment of the present invention.

This embodiment relates to measures taken if the internal reference voltage Vref deviates from the desired value in the above described fifth embodiment. For example, it is assumed that the target value for the internal reference value is 1.2 V and that the value for the accurate resistor Rext is 12 k Ω. In this case, a current flowing through the accurate resistor Rext is Vref/Rext=100 μA.

Here, the internal reference voltage Vref may deviate from 1.2 V owing to a change in manufacturing process or the like. If the internal power voltage Vref becomes 1.25 V, then a current of 125 μA flows through the accurate resistor Rext. The voltage Vr2 also increases with a voltage drop at the resistor R1.

In such a case, the resistor R1 is divided into two parts, and the midpoint between these parts is defined as Vr1 and connected to a negative input terminal of the operational amplifier OP1. Then, a potential difference of 1.25 V−1.2 V=0.05 is absorbed by one (the lower part of R1) of the two parts which is connected to the accurate resistor Rext. Further, the other part (the upper part of R1) connected to an output terminal of the operational amplifier OP1 has a resistance value that meets the relationship Rext:(lower part of R1+upper part of R1)=Rtrim:Rt.

Thus, according to the present embodiment, even with a variation in internal reference voltage Vref, the operational current can be kept constant. Therefore, the value Rtrim can be accurately adjusted.

10. Ninth Embodiment

The impedance trimming circuit according to the ninth embodiment of the present application will be explained.
(1) The impedance trimming circuit according to the ninth embodiment is provided based on the following premise:

The above impedance trimming circuits according to the first to eighth embodiments execute impedance matching with respect to the output impedance, input impedance, terminal resistance or the like, to thereby suppress reflection of signals, thus allowing serial signals to be transferred at a high speed while maintaining their high quality, and automatically perform such trimming at a high accuracy.

However, for example, the output impedance trimming circuit shown in FIG. 7 performs trimming of the output impedance, with the output signal of the code control circuit 13 kept as it is. Thus, shown in FIG. 18, when Vto1 becomes close to Vr1, it repeatedly increases and decreases with respect to Vr1.

As a result, the value of the impedance dummy resistor Rto trim of the output impedance trimming circuit in FIG. 7 continuously varies during trimming of the output impedance. This variation may affect the operation of the circuit.

Similarly, for example, the input impedance trimming circuit shown in FIG. 12 performs trimming of the input impedance, with the output signal of the code control signal 13 kept as it is. Thus, the same phenomenon as in the circuit in FIG. 18 occurs. That is, Vti1 does not constantly vary. As a result, the value of the input impedance dummy resistor Rti trim of the input impedance trimming circuit in FIG. 12 also continuously varies during trimming of the input impedance.

Figure 18:
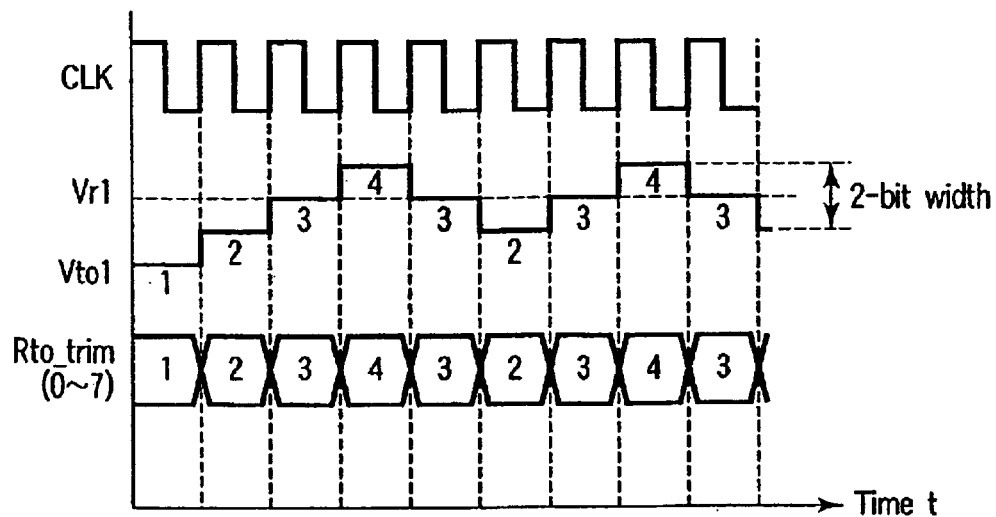
FIG. 18 is a timing chart of the operation of the circuit shown in FIG. 7.

Furthermore, shown in FIG. 18, when Vto1 varies by a two-bit width with respect to Vr1, e.g., Vto1varies between "2" and "4", it is closest to Vr1 when it is "3". Thus, in such a case, trimming can be executed at a high accuracy by fixing the code value which controls the impedance, at a value at which Vto1is "3", i.e., the central value of the variation range of Vto1. The same is true of Vti1.

It can be therefore found by considering the above that when Vto1 or Vti1 reaches a value close to Vr1which is a target value, it is appropriate that the input and output impedance dummy resistors Rto trim and Rti trim be fixed at predetermined values, i.e., the output signal of the code control signal 13 be fixed at a predetermined value.

Then, it should be noted that, for example, the impedance trimming circuit disclosed in patent document 2 (Jpn. Pat. Appln. KOKAI Publication No. 2003-69412) is used as an impedance trimming circuit which latches the value of the output signal of a code control circuit.

Figure 19:
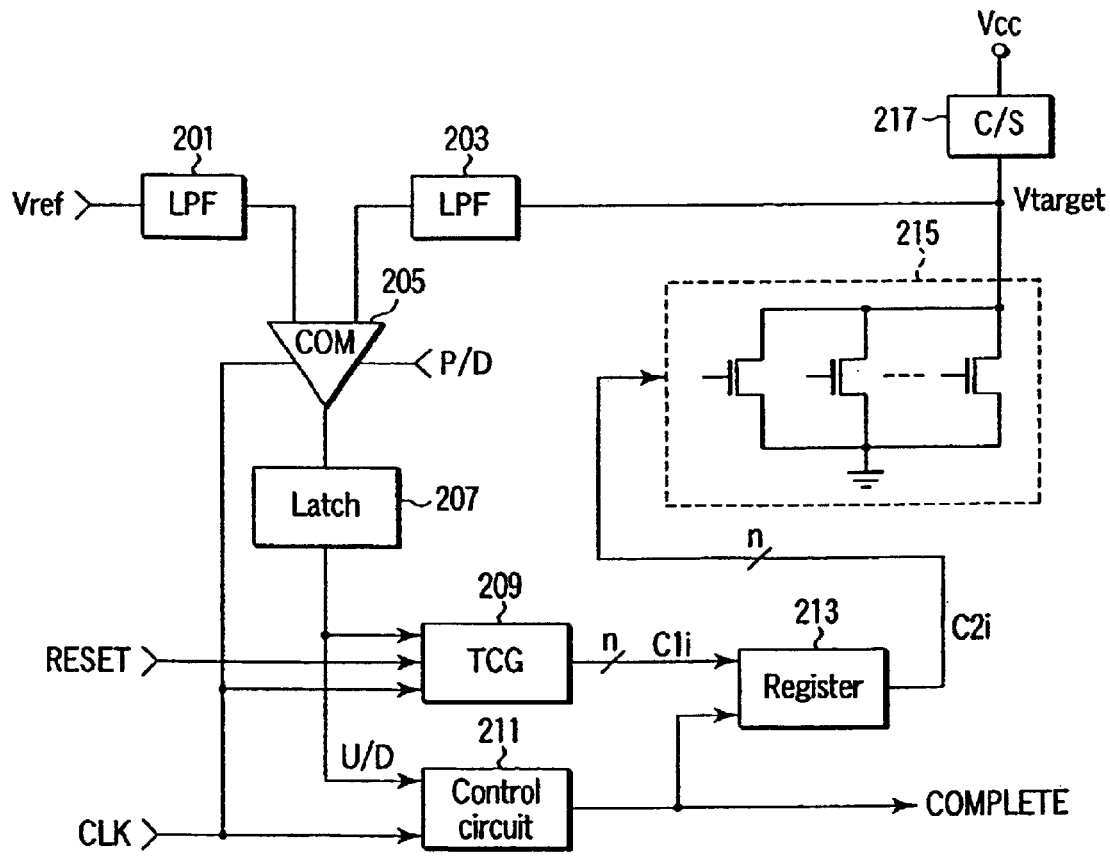
FIG. 19 is a view showing an impedance trimming circuit as a reference example.

FIG. 19 shows a main portion of the impedance trimming circuit disclosed in patent document 2. The points of this circuit will be described below, but its detailed explanation will be omitted.

The first point of the impedance trimming circuit in patent document 2 resides in that trimming of the impedance is carried out without using an external resistor by a current source 215 provided in a chip, unlike the impedance trimming circuit of the present invention. The second point of the impedance trimming circuit of patent document 2 resides in that when Vtarget reaches to a value close to Cref, a thermal code Cli corresponding to the code of the impedance trimming circuit of the present invention is fixed.

Figure 20:
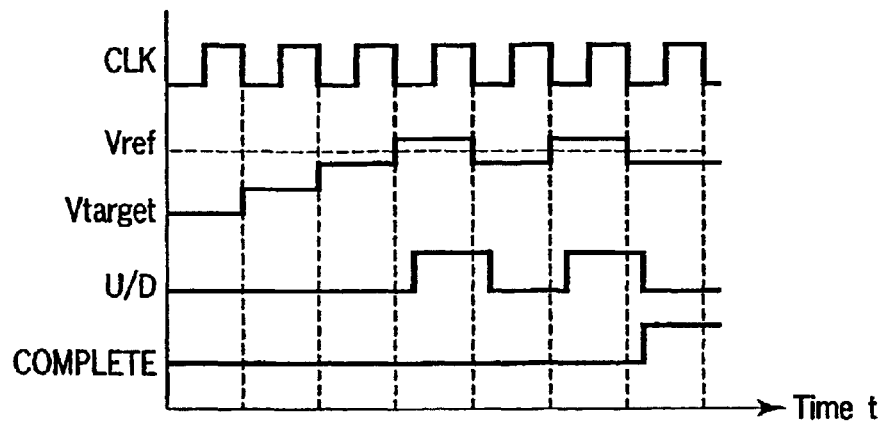
FIG. 20 is a timing chart of the operation of the circuit shown in FIG. 19.
Figure 21:
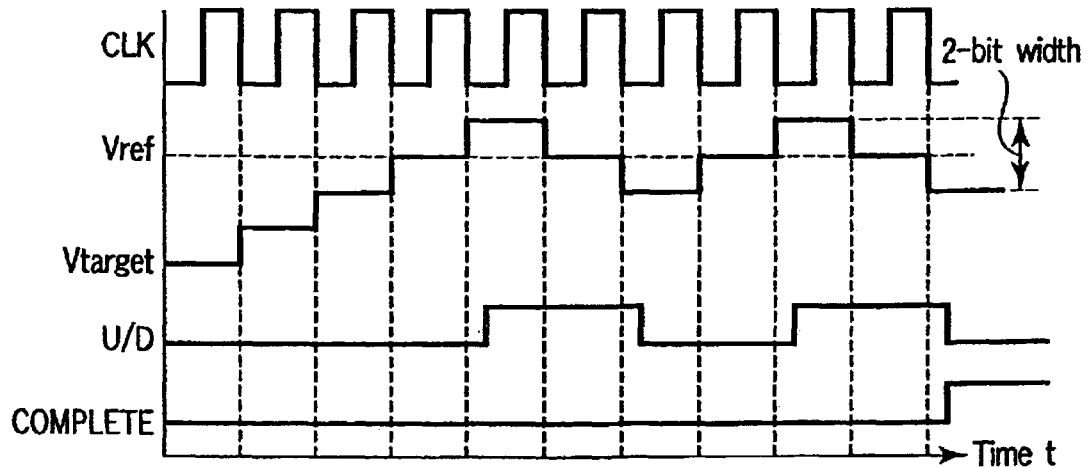
FIG. 21 is a timing chart of the operation of the circuit in FIG. 19.

However, in the impedance trimming circuit of patent document 2, when Vtarget is greater than Vref as shown in, e.g., a timing chart of FIG. 20, a U/D signal becomes "H", and when the number of times Vtarget exceeds Vref reaches two, i.e., the U/D signal becomes "H" twice, the time at which the U/D signal varies from "H" to "L" after becoming "H" twice is detected by a control circuit 211, and then a signal COMPLETE is set at "H", and the value of the thermal code Cli is fixed. Thus, when the signal COMPLETE is set at "H", Vtarget does not coincide with the central value (Vref) of its variation range, as a result of which trimming cannot be performed with a high accuracy.

Therefore, the impedance trimming circuit according to the ninth embodiment, which will be explained below, fixes a code value for use in impedance trimming at a high speed at a value at which Vto1 or Vtil is closest to Vr1 (Vto1=Vr1 or Vtil=Vr1 if Vto1 or Vtil varies by a two-bit width with respect to Vref), when Vto1 or Vtil reaches a value close to Vtil which is a target value.

(2) Example 1

FIG. 22 shows example 1 of the impedance trimming circuit according to the ninth embodiment of the present invention.

Rdrv (symbol Δ) denotes an output driver.

A common bias section 11 includes an internal variable resistor R1a connected via a node Vr1, a precision external resistor Rext, an operational amplifier OP1 to which an internal reference voltage Vref and a voltage of the node Vr1 are to be applied, P-channel MOS transistors P1a and P1b, and an N-channel MOS transistor N1. The P-channel MOS transistor P1a and P1b are connected to a power supply VDD. These transistors are bias generating circuits for generating a constant-current bias, and also accessory circuits.

Explanations for the operation of the common bias section 11 and an example of the operation will be omitted, since they are the same as those of the common bias section shown in FIG. 7.

The output impedance trimming section 12 comprises a comparator CMP to which voltages Vr1 and Vto1 are to be applied, an operational amplifier OP2 to which voltages Vr1 and Vto2 are to be applied, a code control circuit 13 which receives the output signal of the comparator CMP, an N-channel MOS transistor (current control element) N2, an internal resistor Rto, an output impedance dummy resistor Rto trim, and an output driver dummy resistor Rdrv.

The operational amplifier OP2 controls the gate voltage of the N-channel MOS transistor N2 such that the voltage Vto2 is equal to the voltage Vr2. In this state, the voltage Vto1 is determined by the ratio between resistors Rto and Rto trim+Rdrv. It is important that the ratio of Rext to R1 is equal to that of Rto trim+Rdrv to Rto. That is:

$$Rext:R1=(Rto\ trim+Rdrv):Rto$$

The external resistor Rext is highly accurate. Thus, even if the manufactured output impedance trimming sections are variant with respect to each of the resistors R1, Rto, Rto trim and Rdrv, in general, if the relative precision between the internal resistors R1 and Rto is high, the value of Rto trim+Rdrv can be made to fall within a standard range.

The code control circuit 13 comprises, e.g., a multistage shift register in which the code value varies in response to a clock signal CLK. The output of the comparator CMP which is obtained as a result of comparison between Vr1 and Vto1 is input to the multi-stage shift register. The figures of the code value are taken out from the respective stages of the shift register, and turning on/off of the resistors is switched. In order to switch turning on/off of the resistor, the second example of the prior art can be used.

Vto1 varies by degrees to reach Vr1 provided as a target value, in synchronism with the clock signal CLK. Then, when the relationship between Vr1 and Vto1 repeatedly varies, i.e., Vto1 increases and decreases with respect to Vr1, the code control circuit 13 outputs a code value at which Rto trim+Rdrv is closest to the standard value.

Explanations for the operation of the output impedance trimming section 12 and an example of the operation will be omitted, since they are not greatly different from those of the output impedance trimming section shown in FIG. 7.

A code flattening section 15 includes a code flattening circuit 16.

The code flattening circuit 16 receives the output signal (code value) of the code control circuit 13. The code flattening circuit 16 outputs the output signal of the code control circuit 13 as an output signal SEL, as it is, when Vto1 always varies in one direction (e.g., plus direction) toward Vr1. Then, when Vto1 is closest to Vr1, the code flattening circuit 16 fixes the output signal (code value) of the code control circuit 13 at a value at which Vto1 is closest to Vr1, and thereafter outputs the fixed code value as the output signal SEL.

FIG. 23 shows an example of the code flattening circuit.

A register 17 latches a code control signal (code value) output from the code control circuit 13 shown in FIG. 22. To the register 17, a down detection signal DOWN is input. When the down detection signal DOWN becomes "H", the register 17 latches the code control signal.

A down detection signal generating circuit 18 synchronizes with the clock signal CLK, fetches an up/down signal UP/DOWN, which is disclosed in, e.g., FIG. 10, and outputs the down detection signal DOWN on the basis of the up/down signal UP/DOWN.

The example shown in FIG. 10 has the following circuit structure: when Vto1 is greater than Vr1, the up/down signal UP/DOWN becomes "H" (="1"), and when Vto1 is smaller than Vr1, the up/down signal UP/DOWN becomes "L" (="0")

In the example of FIGS. 22 and 23, it is considered that Vto1 gradually increases from a condition satisfying Vto1<Vr1. Thus, in those examples, the example of FIG. 10 is modified to achieve the following circuit structure: when Vto1 is smaller than Vr1, the up/down signal UP/DOWN becomes "H" (="1"), and when Vto1 is greater than Vr1, the up/down signal UP/DOWN becomes "L" (="0"). Such a circuit structure can be easily achieved by modifying the comparator CMP.

In example 1, the up/down signal UP/DOWN becomes "H" (UP) when Vto1 is smaller than Vr1. This indicates that Vto1 increases toward Vr1, and thus the down detection signal is kept "L".

On the other hand, the up/down signal UP/DOWN becomes "L" (DOWN) when Vto1 is greater than Vr1. This indicates that Vto1 exceeds Vr1. Thereafter, since Vto1 needs to be decreased, the down detection signal DOWN is made to be "H".

Suppose that at the time of impedance trimming, Vto1 increases by degrees toward Vr1, i.e., the target value, as stated above.

Needless to say, as a modification, suppose that Vto1 gradually decreases toward Vr1 (target value), an up detection signal generating circuit for detecting that Vto1 increases may be provided as a modification of the down detection signal generating circuit 18. (In this case, the structure in FIG. 10 can be used as it is).

A multiplexor (MUX) 19 selects and outputs one of the output signal (code control signal) of the code control circuit 13 and the output signal of the register 17, which are shown in FIG. 22.

To be more specific, when the down detection signal DOWN is "L", the multiplexor (MUX) 19 selects and outputs the output signal (code control signal) of the code control circuit in FIG. 22. When the down detection signal DOWN is "H", the multiplexor (MUX) 19 selects and outputs the output signal of the register 17.

That is, once the down detection signal DOWN becomes "H", the multiplexor (MUX) 19 necessarily selects and outputs the output signal of the register 17.

A bit variation monitoring circuit 20 always monitors the code control signal (code value), i.e., a bit value. Then, when the bit value becomes the maximum value (which is "7" in the case where the bit value varies from the range of "0" to "7"), the bit variation monitoring circuit 20 outputs a predetermined value (e.g., "6") as a bit value.

At this time, the bit variation monitoring circuit 20 outputs a control signal CT for use in controlling the operation of a multiplexor (MUX) 21, so that the multiplexer (MUX) 21 selects the output signal of the bit variation monitoring circuit 20.

In general, the bit variation circuit 20 is provided by a user's request. Thus, it may be omitted.

Next, the operation of the output impedance trimming circuit shown in FIGS. 22 and 23 will be explained.

Figure 24:
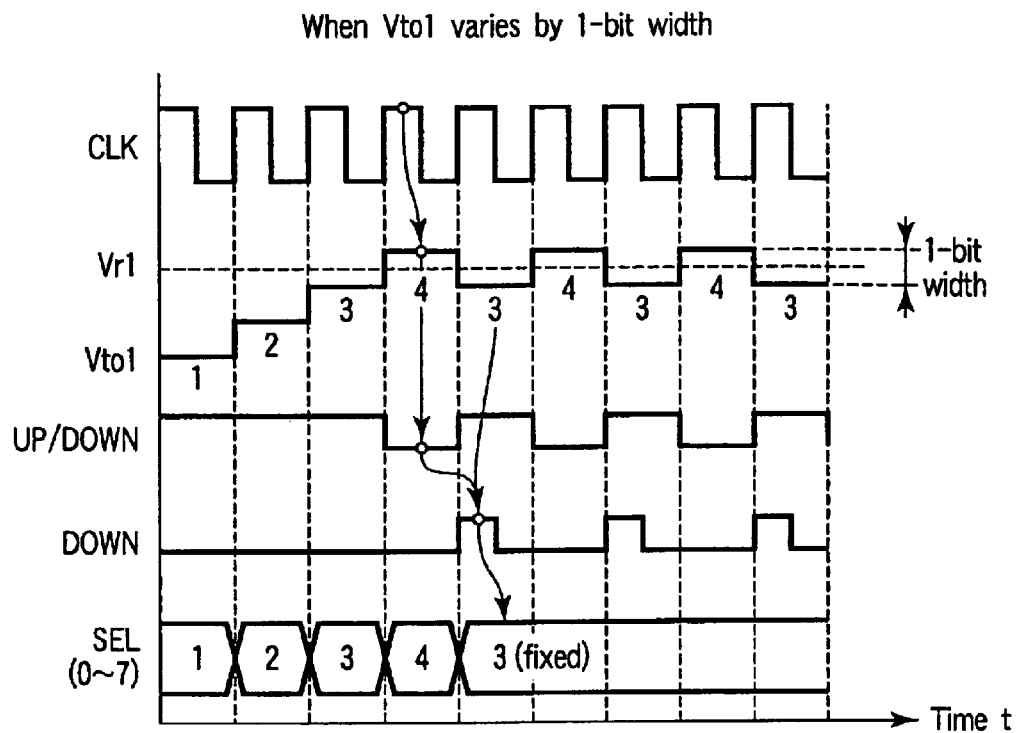
FIG. 24 is a timing chart of the operation of the circuit shown in FIG. 22.

First, the case where Vto1 periodically increases and decreases with respect to Vr1 will be explained by referring to the timing chart in FIG. 24.

In the initial state, Vto1 is far from Vr1. Thus, Vto1 synchronizes with the clock signal CLK, and increases by degrees. In order that the operation be easily understood, in the following explanation, Vto1 is expressed by "0" to "7" to correspond to the code control signal (the code value of which varies from the range of "0" to "7") output from the code control circuit 13.

Under the above condition, since Vto1 continuously increases, the down detection signal generating circuit 18 continuously maintains "L" as the value of, e.g., the down detection signal DOWN. At this time, the register 17 does not latch the code control signal, and the multiplexor (MUX) 19 selects and outputs the code control signal from the code control circuit 13.

Furthermore, since the value of the code control signal is not the maximum value, the bit variation monitoring circuit 20 controls the multiplexor 21 such that the multiplexor 21 selects and outputs the output signal of the multiplexor 19.

When Vto1 is in the vicinity of Vr1, it repeatedly increases and decreases with respect to Vr1. For example, in the example of FIG. 24, Vto1 repeatedly varies between "3" and "4". That is, Vto1 varies by a 1-bit width with respect to Vr1.

The code control circuit 13 outputs "L" (="0") as the up/down signal UP/DOWN, when Vto1 varies to be greater than Vr1. When the down detection signal generating circuit 18 in the code flattening circuit 16 detects that the up/down signal UP/DOWN becomes "L", it determines that Vto1 will decrease, and makes the down detection signal DOWN "H".

The down detection signal generating circuit 18 may be formed to output the down signal (pulse signal) DOWN, when detecting a down edge of Vto1 (variation from "4" to "3").

When receiving the first down detection signal DOWN, the register 17 latches "31" as the code control signal, and thereafter, does not accept the input signal. At the same time, the multiplexor 19 selects and outputs the output signal of the register 17, and thereafter, always selects and outputs the output signal of the register 17.

In such a manner, when Vto1 is in the vicinity of Vr1, the code flattening circuit 16 fixes the code control signal (code value) at a value at which Vto1 is closest to Vr1, i.e., "3" in this example. Thus, in precision trimming of the example, the resistance value (code value) of a resistor Rto use for use in actual trimming of an output impedance can be fixed at an optimal value at a high speed, and thus, it is not necessary to consider the influence of the trimming upon other circuits.

In the example, when Vto1 is in the vicinity of Vr1, and then when it repeatedly increases and decreases with respect to Vr1, the output signal (code control signal) SEL of the code flattening circuit 16 is fixed after detection of the first down edge of Vto1. In such a manner, the output signal SEL of the code flattening circuit 16 is fixed at an optical value at a high speed.

Figure 25:
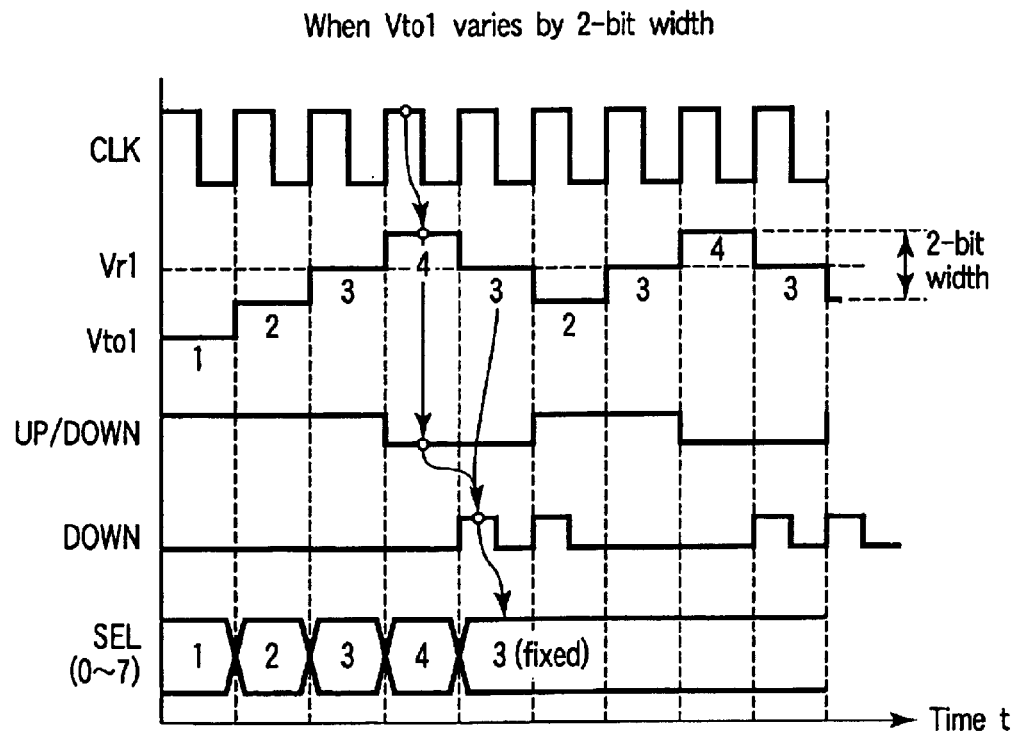
FIG. 25 is a timing chart of the operation of the circuit in FIG. 22.

In the example, when Vto1 (="3")<Vr1, the output signal (code control signal) SEL of the code flattening circuit 16 is fixed. However, as shown in the timing chart of FIG. 25, the output signal (code control signal) SEL of the code flattening circuit 16 may be fixed when Vto1 (="4")>Vr1.

Figure 26:
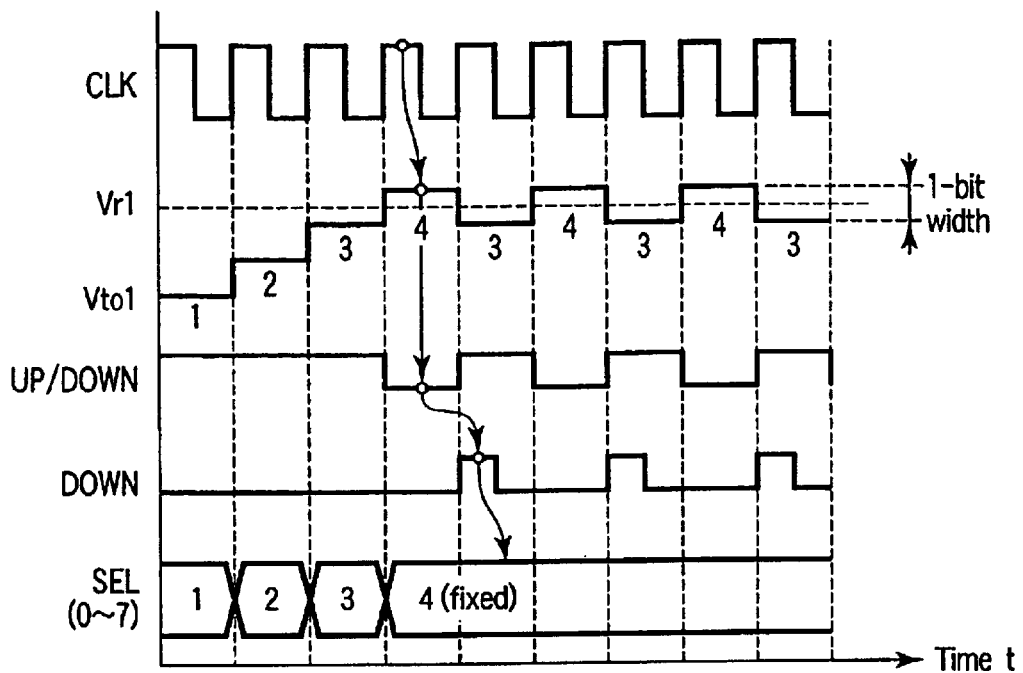
FIG. 26 is a timing chart of the operation of the circuit in FIG. 22.

Next, the case where Vto1 periodically increases and decreases by a two-bit length in the vicinity of Vr1 will be explained with reference to the timing chart of FIG. 26.

In the initial state, as stated above, Vto1 gradually increases in synchronism with the clock signal CLK. Under such a condition, since Vto1 continuously increases, the down detection signal generating circuit 18 maintains "L" as the value of, e.g., the down detection signal DOWN. At this time, the register 17 does not latch the code control signal, and the multiplexor (MUX) 19 selects and outputs the code control signal from the code control circuit 13.

Furthermore, since the value of the code control signal is not the maximum value, the bit variation monitoring section 20 controls the multiplexor 21 such that the multiplexor 21 selects and outputs the output signal of the multiplexor 19.

When Vto1 is in the vicinity of Vr1, it repeatedly increases and decreases with respect to Vr1. For example, in the example of FIG. 26, Vto1 varies between "2" and "4", i.e., it varies by a two-bit length with respect to Vr1.

The down detection signal generating circuit 18 in the code flattening circuit 16 makes the down detection signal DOWN "H", when detecting that the up/down signal UP/DOWN becomes "L" (DOWN), and then Vto1 decreases.

As stated above, the down detection signal generating circuit 18 may be formed to output the down signal (pulse signal) DOWN when detecting a down edge (variation from "4" to "3" and that from "3" to "2") of Vto1.

The register 17 latches "3" as the code control signal, when receiving the first down detection signal DOWN, and thereafter, does not accept the input signal. At the same time, the multiplexor 19 selects and outputs the output signal of the register 17, and thereafter always selects and outputs the output signal of the register 17.

In such a manner, when Vto1 is in the vicinity of Vr1, the code flattening circuit 16 fixes the code control signal (code value) at a value at which Vto1 is closest to Vr1, i.e., "3" in this example. Thus, in precision trimming of the example, the resistance value (code value) of the resistor Rto use for use in actual trimming of an output impedance can be fixed at an optimal value at a high speed, and thus, it is not necessary to consider the influence of the internal circuits upon external circuits.

In the example also, the output signal (code control signal) SEL of the code flattening circuit 16 is fixed when the first down edge of Vto1 is detected. In such a manner, the output signal SEL, of the code flattening circuit 16 is fixed at an optimal value at a high speed.

Further, in the example, Vto1 varies by a two-bit length with respect to Vr1. Thus, the code flattening circuit 16 fixes the output signal (code control signal) SEL when Vto1 (="3")=Vr1. In such a manner, in the example, trimming of the output impedance can be carried out at a high precision.

Figure 27:
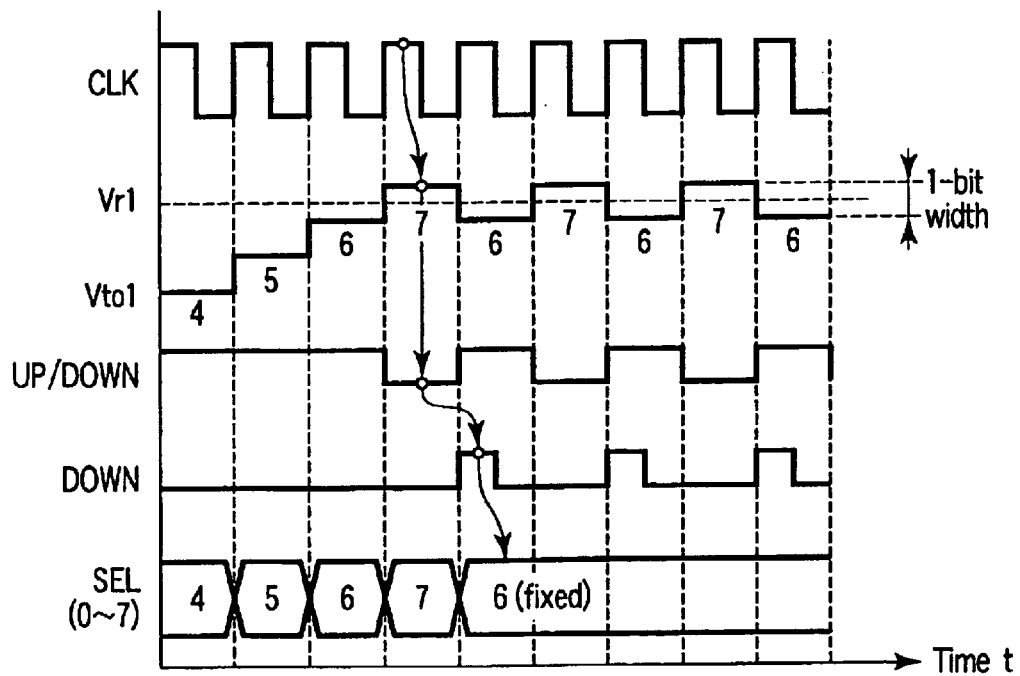
FIG. 27 is a timing chart of the operation of the circuit in FIG. 22.

FIG. 27 shows a timing chart of Vto1 which varies with respect to the maximum value "7". At this time, the bit variation monitoring circuit 20 forcibly outputs a predetermined value, which is "6" in this example, as the output signal SEL of the code flattening circuit 16, regardless of the code control signal from the code control circuit 13.

(3) Example 2 of the circuit

FIG. 28 shows example 2 of the impedance trimming circuit according to the ninth embodiment of the present invention.

The impedance trimming circuit provided as example 2 is an input impedance trimming circuit. This circuit does not need the driver dummy resistor or the driver, and merely performs trimming of the resistor, and adjusts the input impedance by using the obtained code, unlike the above output impedance trimming circuit.

Except the above points, an input impedance trimming circuit 14 does not greatly differ from the output impedance trimming section 12 shown in FIG. 22. Further, a code flattening circuit 16' of a code flattening section 15' is the same as the code flattening circuit 16 of the code flattening section 15 in FIG. 22.

The operation of the above input impedance trimming circuit is the same as that of the impedance trimming circuit according to the first embodiment, and its explanation will be omitted.

(4) Example 3 of the circuit

Figure 29:
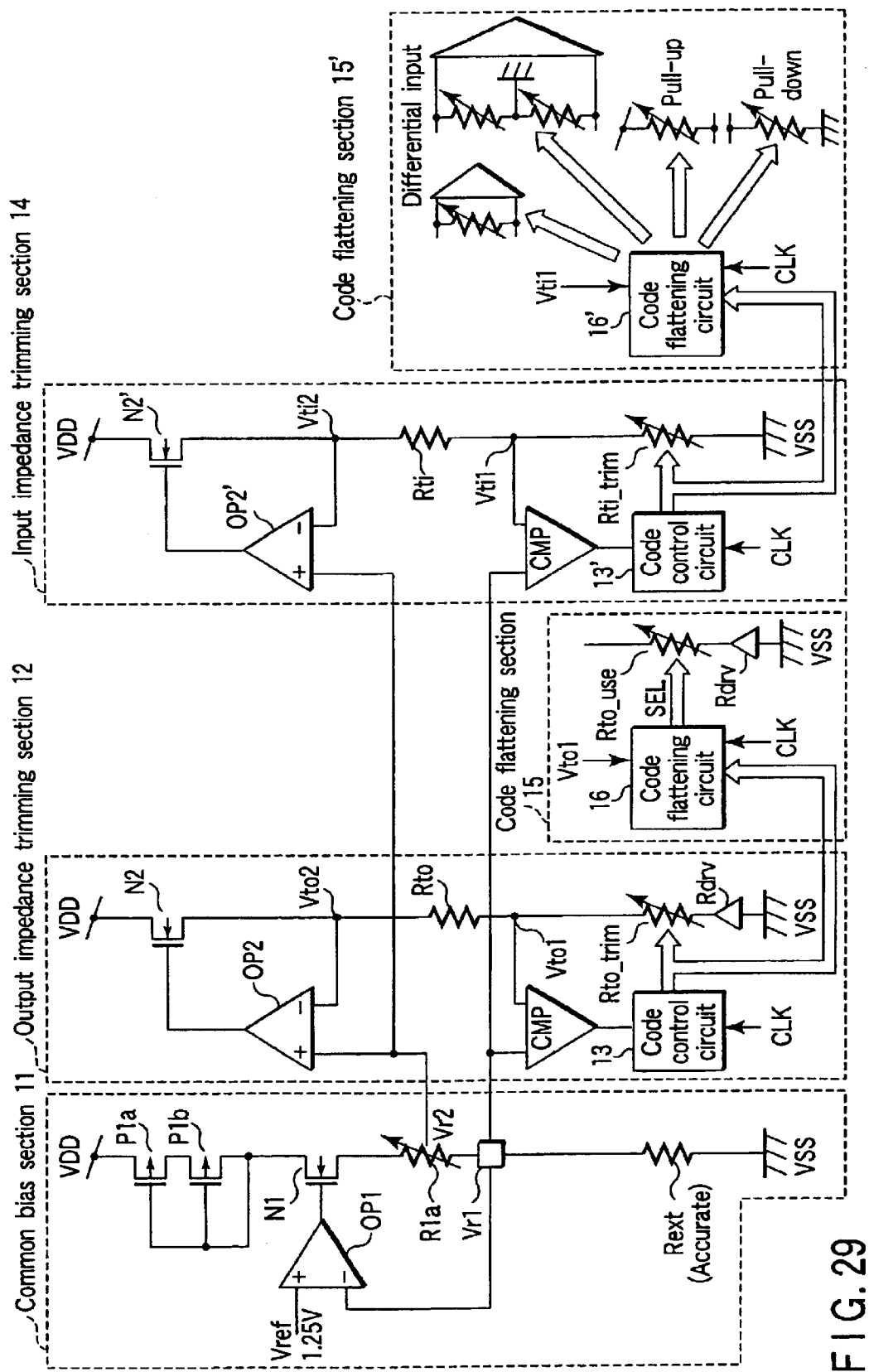
FIG. 29 is a view showing the input/output impedance trimming circuit according to the ninth embodiment.

FIG. 29 shows example 3 of the impedance trimming circuit according to the ninth embodiment of the present invention.

The impedance trimming circuit provided as example 3 is an input/output impedance trimming circuit. This circuit includes an output impedance trimming section 12 and an input impedance trimming section 14. In this case, a common bias section 11 is shared with the input impedance trimming section 12 and the output impedance trimming section 14.

The output impedance trimming section 12 and the code flattening section 15 are the same as the output impedance trimming section 12 and code flattening section 15 shown in FIG. 22. The input: impedance trimming section 14 and the code flattening section 15' are the same as the input impedance trimming section 14 and code flattening section 15' shown in FIG. 28.

The operation of the input/output impedance trimming circuit is the same as that of the impedance trimming circuit according to the first embodiment, and its explanation will be omitted.

11. Conclusion

As described in the first to eighth embodiments, the following effects are produced by the impedance trimming circuit according to the example of the present invention:

The circuit can be manufactured using a normal CMOS LSI manufacturing process.

Only one external resistor is required. This is advantageous in terms of costs.

The impedance can be kept constant even with a change in the value for the external accurate resistance.

The impedance can be kept constant even with a change in the layout of the LSI or in parasitic resistance.

The number of adjustment codes can be easily increased to easily accomplish accurate adjustments.

The adjustment of the output impedance is also executed on the driver and is thus very accurate.

The yield can be easily increased in spite of a wider range of variation.

The circuit can be divided into a number of elements. Accordingly, the elements can be easily shared, and the area of the circuit car be reduced.

The resistance values of the resistor elements used in the LSI can be dynamically determined.

The resistance values of the resistor elements in the LSI can be determined at a high precision, since resistor elements having precision resistance values are provided outside the LSI.

The value (code value) of a code control signal for use in impedance trimming is immediately fixed to an optimal value on the basis of the first down detection signal DOWN. In such a manner, the optimal resistance values of the resistor elements for use in impedance trimming can be determined at a high speed. In addition, thereafter, the determined resistance values are fixed, and thus, the influence of the internal circuits upon external circuits can be reduced.

Especially, when Vto1 varies by a two-bit width with respect to Vo1, impedance trimming can be carried out by using a code value (resistance value) at which Vto1 is equal to Vr1. Accordingly, trimming of high accuracy can be executed.

Figure 30:
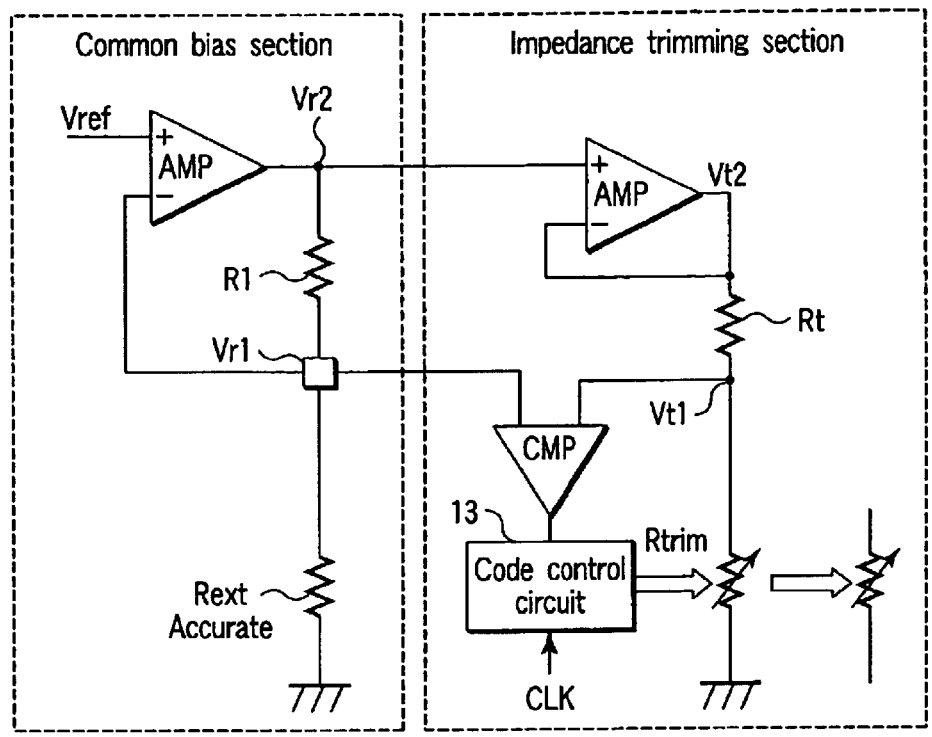
FIG. 30 is a view showing base elements in the impedance trimming circuit according to an example of the present invention.
Figure 31:
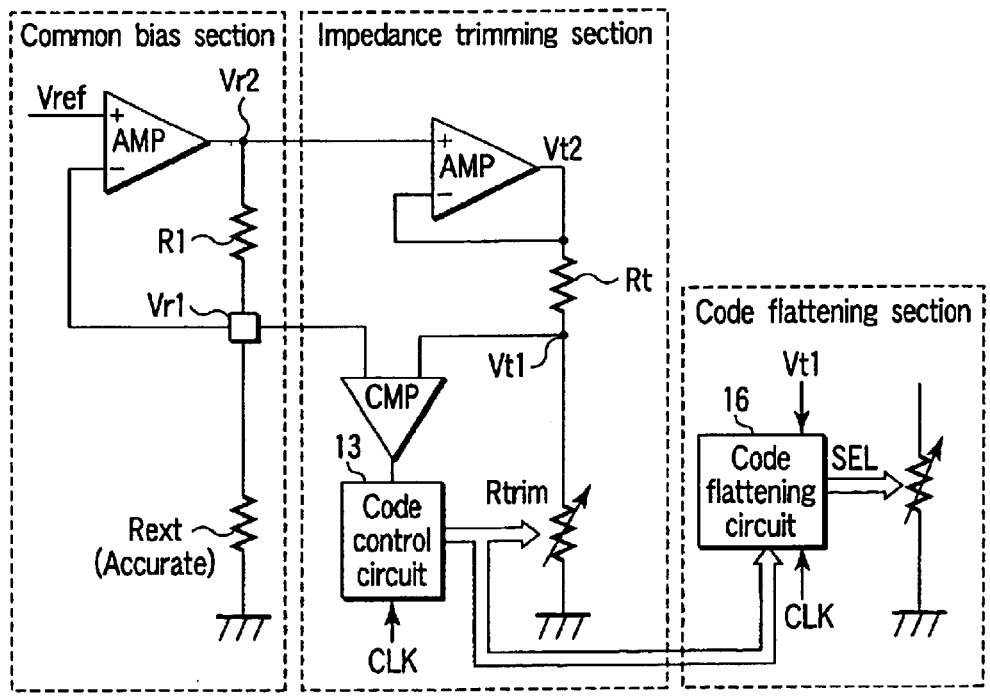
FIG. 31 is a view showing base elements in the impedance trimming circuit according to another example of the present invention.

FIGS. 30 and 31 show the essential elements of the present invention which are used to accomplish these effects. The concept of the present invention is that for the resistance values of the resistance elements, the value Rtrim is set so as to establish a relationship closest to Rext:R1=Rtrim:Rt.

Further, it should be appreciated that within the scope of this concept, the following variations are possible.

The P channel MOS transistor (current driver) is connected to the power terminal VDD in order to increase an output current from a power amplifier.

Likewise, a source follower of the N channel MOS transistor is connected to the power terminal VDD.

The resistor R1 is formed inside the LSI so that the resistance value of the resistor R1 can be varied in accordance with the resistance value of the external resistor Rext.

The code control circuit is composed of a latch and a coder instead of the multistage shift register.

The number of states of a code signal is increased or reduced on the basis of the relationship between the adjustable variation range and adjustment accuracy.

Unit resistors of the same shape are arranged close to each other within the LSI in order to improve the relative accuracy for the resistors R1 and Rt.

The relationship between the reference voltage Vref and the power voltage VDD is kept constant, and the relationship between the power voltage VDD and ground voltage VGNBD of the whole circuit is reversed.

The value for the resistor Rt is adjusted rather than adjusting the value for the resistor R1 in accordance with the value for the external resistor Rext and the parasitic resistance.

A fixed ratio is maintained between the resistor Rtrim for a feedback system and an actual target impedance trimming resistor (an output driver section and an input resistance section).

In the case where the code control circuit outputs codes the values of which decrease by degrees, the down detection signal generating circuit in the code flattening circuit is replaced by the up signal generating circuit.

The impedance trimming circuit according to the ninth embodiment of the present invention can be applied to various kinds of semiconductor integrated circuits which are required to execute impedance matching with respect to the output impedance, input impedance, terminal resistor, or the like.

As described above, according to the impedance trimming circuit according to the example of the present invention, an accurate trimming operation can be performed by eliminating the adverse effects of variations associated with the LSI manufacturing process. Further, the circuit can be constructed using a reduced number of external parts, thus reducing manufacturing costs.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An impedance trimming circuit comprising:
a common bias section composed of a first series circuit having a first resistor and a second resistor connected in series via a first node and a first operational amplifier having a first input terminal being inputted a reference voltage, a second input terminal connected to the first node, wherein an output signal of the first operational amplifier controls a voltage of the first node; and
an impedance trimming section composed of a second series circuit having a third resistor and an impedance dummy resistor connected in series via a second node, a comparator having a first input terminal connected to the first node and a second input terminal connected to the second node, a code control circuit latching an output signal from the comparator to generate switching codes, which controls a value of the impedance dummy resistor,
wherein the switching codes control a value of a target impedance trimming resistor.

2. The impedance trimming circuit according to claim 1, which further comprises a code flattening section configured to latch one of the plurality of switching codes output from the code control circuit, the code flattening section fixes a value of the target impedance trimming resistor based on said one of the plurality of switching codes.

3. The impedance trimming circuit according to claim 2, wherein when said one of the plurality of switching codes output from the code control circuit repeatedly periodically varies, said one of the plurality of switching codes is latched by the code flattening section.

4. The impedance trimming circuit according to claim 3, wherein values of the plurality of switching codes output from the code control circuit increase by degrees in accordance with an output signal of the comparator, and when a value of one of the plurality of switching codes decreases at first, the code flattening circuit latches one of the plurality of switching codes.

5. The impedance trimming circuit according to claim 3, wherein each of the plurality of switching codes is expressed by n bits (n=more than 1), and when said one of the plurality of switching codes output from the code control circuit repeatedly periodically varies between two bits, the code flattening circuit latches one of the two bits.

6. The impedance trimming circuit according to claim 3, wherein each of the plurality of switching codes is expressed by n bits (n=more than 1), and when said one of the plurality of switching codes output from the code control circuit repeatedly periodically varies between three bits, the code flattening circuit latches an intermediate one of the three bits.

7. The impedance timing circuit according to claims 1, wherein the common bias section and the impedance trimming section comprise a unit.

8. The impedance timing circuit according to claims 1, wherein the impedance dummy resistor includes an output buffer.

9. The impedance timing circuit according to claims 1, wherein the impedance dummy resistor includes input impedance, terminal resistance, and pull-up resistance or pull-down resistance.

10. The impedance timing circuit according to claims 1, wherein the plurality of switching codes from the code control circuit and a value of the impedance dummy resistor exhibit a reciprocal relationship, a polygonal-line relationship, or an S shaped relationship.

11. The impedance timing circuit according to claims 1, wherein values of the first and third resistors contain parasitic resistance parasitic on a package, a lead, or a frame, and are adjusted to shift an adjustment range of a value of the impedance dummy resistor.

12. The impedance timing circuit according to claims 1, wherein the second resistor is an accurate resistor, and the values of the first and third resistors are decided on the basis of a value of the second resistor.

13. The impedance timing circuit according to claims 1, wherein values of the first and third resistors are decided on the basis of the parasitic resistance parasitic on a package, lead, and frame, as well as the value of the second resistor.

14. The impedance timing circuit according to claims 1, wherein the first resistor is composed of a first and second resistance elements, the first resistor generates a voltage equal to a difference between a value of the reference voltage and a value of the reference voltage during operation, and values of the first and second resistance elements are adjusted in accordance with a values for the reference voltages so as to meet the following relationship:

$$Rext{:}R1under+R1upper=Rtrim{:}Rt$$

(where Rext denotes a value of the second resistor, R1 under denotes a value of the first resistance element, R1 upper denotes a value of the second resistance element, Rtrim denotes a value of the impedance dummy resistor, and Rt denotes a value of the third resistor).

15. The impedance timing circuit according to claims 1, wherein the second resistor is replaced with a resistor which operates more accurately than the first and third resistors and the impedance dummy resistor.

16. The impedance timing circuit according to claims 1, wherein the impedance trimming section has a second operational amplifier, a first input terminal of the second operational amplifier is connected to the first series circuit, and a second input terminal and an output terminal of the second operational amplifier are connected to the second series circuit.

17. The impedance trimming circuit according to claims 1, wherein a value of the impedance dummy resistor maintains a relationship with a value of the target impedance trimming resistor such that the value of the impedance dummy resistor is an integer number of times greater than the value of the target impedance trimming resistor.

18. The impedance trimming circuit according to claims 1, wherein the impedance trimming section is one of an output impedance trimming section and an input impedance trimming section, the output impedance trimming section being configured to trim an output impedance, the input impedance trimming section being configured to trim an input impedance.

19. An impedance trimming circuit comprising:

a common bias section comprising a first series circuit and a first operational amplifier, the first series circuit including a first resistor and a second resistor are connected in series via a first node, the first operational amplifier including a first input terminal to which a reference voltage is to be applied, and a second input terminal connected to the first node, wherein an output signal of the first operational amplifier controls a voltage of the first node;

an output impedance trimming section comprising a second series circuit, a first comparator and a first code control circuit, the second series circuit including a third resistor and an output impedance dummy resistor which are connected in series via a second node, the first comparator including a first input terminal connected to the first node, and a second input terminal connected to the second node, the first code control circuit latching an output signal from the first comparator to generate first switching codes which control a value of the output impedance dummy resistor; and an input impedance trimming section comprising a third series circuit, a second comparator and a second code control circuit, the third series circuit including a fourth resistor and an input impedance dummy resistor which are connected in series via a third node; the second comparator including a first input terminal connected to the first node and a second input terminal connected to the third node, the second code control circuit latching an output signal from the second comparator to generate second switching codes which control a value of the input impedance dummy resistor, wherein:

the first switching codes control a value of a first target impedance trimming resistor, and the second switching codes control a value of a second target impedance trimming resistor.

* * * * *

UNITED STATES PATENT AND TRADEMARK OFFICE
CERTIFICATE OF CORRECTION

PATENT NO.         : 6,836,170 B2
APPLICATION NO. : 10/723101
DATED                 : December 28, 2004
INVENTOR(S)       : Nobutaka Kitagawa et al.

It is certified that error appears in the above-identified patent and that said Letters Patent is hereby corrected as shown below:

On The Title Page, Item (73) Assignee should read
--(73) Assignees: Kabushiki Kaisha Toshiba. Tokyo (JP)
                    Toshiba IT-Solutions Corporation Kanagawa Prefacture 212-8550 (JP)--.

Signed and Sealed this

Nineteenth Day of December, 2006

JON W. DUDAS
*Director of the United States Patent and Trademark Office*